US006888729B2

(12) United States Patent
Maekawa et al.

(10) Patent No.: US 6,888,729 B2
(45) Date of Patent: May 3, 2005

(54) SINGLE MODULE ELECTRIC POWER CONVERSION APPARATUS

(75) Inventors: Hirotoshi Maekawa, Tokyo (JP); Syougo Matsuoka, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 251 days.

(21) Appl. No.: 10/115,105

(22) Filed: Apr. 4, 2002

(65) Prior Publication Data

US 2003/0072117 A1 Apr. 17, 2003

(30) Foreign Application Priority Data

Oct. 12, 2001 (JP) ........................................ 2001-315113

(51) Int. Cl.[7] ........................ H02M 7/537; H02H 7/122
(52) U.S. Cl. ............................. 363/56.02; 363/56.03; 363/131
(58) Field of Search ........................... 363/56.02, 56.03, 363/56.04, 56.05, 98, 132, 50, 55, 147

(56) References Cited

U.S. PATENT DOCUMENTS 4,965,710 A    10/1990  Pelly et al.
5,327,064 A *  7/1994  Arakawa et al. ............ 318/801
6,215,679 B1   4/2001  Yamane et al.

FOREIGN PATENT DOCUMENTS

| JP | 2000-217367   | 8/2000  |
| JP | 2000-324893   | 11/2000 |
| JP | 2001-186778   | 7/2001  |
| JP | 2001-224169 A | 8/2001  |
| JP | 2001-268928   | 9/2001  |

OTHER PUBLICATIONS

Japanese Office Action dated Mar. 16, 2004, including English Translation.
French Office Action dated Apr. 20, 2004.

* cited by examiner

Primary Examiner—Bao Q. Vu
(74) Attorney, Agent, or Firm—Sughrue Mion, PLLC

(57) ABSTRACT

To perform a miniaturization and weight reduction of an electric power conversion apparatus, and in extension, the miniaturization of an inverter apparatus itself. In the inverter apparatus which converts a DC voltage into an AC voltage, a semiconductor device for electric power conversion, and a drive and protection circuit which drives and protects this semiconductor device for electric power conversion, and a power supply circuit which supplies power to this drive and protection circuit are integrated in the same module.

14 Claims, 17 Drawing Sheets

SINGLE MODULE ELECTRIC POWER CONVERSION APPARATUS

This application is based on Application No. 2001-315113, filed in Japan on Oct. 12, 2001, the contents of which are hereby incorporated by reference.

BACKGROUND OF THE INVENTION

1. Field of the Invention

This invention relates to an electric power conversion apparatus used for an electric vehicle driving apparatus or an inverter apparatus, and in particular, to structure for miniaturization and weight reduction, and advanced functionality of drive and protection means of a semiconductor device for electric power conversion, failure diagnosis, or the like.

2. Description of the Related Art

In the electric vehicle, in particular, an electric motorcar, or a hybrid car, the miniaturization and weight reduction of an inverter apparatus for three-phase motor drive are required for a mounting space and fuel cost reduction. Generally, an inverter apparatus consists of an electric power conversion apparatus for converting a DC voltage into an AC voltage, and a controller that controls a three-phase motor. Usually, they are contained in separate cases respectively due to problems of heat generation and switching noise of the semiconductor device for electric power conversion.

As for the electric power conversion apparatus, an intelligent module where a high-speed semiconductor device represented by an IGBT and a circuit for driving and protecting the IGBT are integrated has been already produced commercially. For example, as shown in Japanese Patent Laid-Open No. 5-137339, the structure of arranging an IGBT drive and protection circuit board on a semiconductor device is disclosed.

In addition, as for a controller, a high-performance microcomputer is usually used, and arbitrarily controls the rotation speed, torque, and electric power of a three phase motor by inputting a line current, a rotating speed, etc. of the three phase motor from dedicated sensors and performing data processing, and giving a switching signal to a gate terminal of a semiconductor device in the electric power conversion apparatus. In addition, although a pulse width modulation waveform called PWM is used as a switching signal waveform given to a gate terminal of a semiconductor device for electric power conversion, since it is general technique, detailed explanation will be omitted here.

In the configuration of a conventional inverter apparatus, as shown in FIG. 18, an electric power conversion apparatus 123 including a signal insulation circuit 115a and a U phase arm typically showing only one phase of three phases, and a controller 121 including a microcomputer 114a etc. are respectively contained in separate cases. However, a power supply 122 supplying power to an IGBT drive and protection circuit board is also contained in a case different from these due to problems of heat generation and noise. In addition, the U phase arm includes a UH phase (upper arm U phase) drive and protection circuit 117a, a UL phase (lower arm U phase) drive and protection circuit 118a, and switching devices 2a and 2b and free wheel diodes 3a and 3b as electric power conversion devices. Reference numeral 20 is a three-phase motor.

The power supply 122 which includes an waveform shaping circuit 26 and an insulation type power supply circuit 116a and supplies power to an IGBT drive and protection circuit board may be integrated in an IGBT drive and protection circuit board in an intelligent module in the case of that with comparatively small power capacity. Nevertheless, since the current capacity of the power supply circuit itself also becomes large in that with large power capacity, the power supply circuit is contained in a case different from an intelligent module due to a cooling method of suppressing heat generation of a power transformer etc., and a problem of a board mounting space.

In addition, since a malfunction of an electronic component mounted on the board is induced due to the influence of electromagnetic noise at the time of IGBT performing switching operation, it is devised to simply obtain the effect of electromagnetic shielding in a conventional IGBT drive and protection circuit board by arranging all the electronic components on the top surface (C side) of the board and making the back surface (S side) fully grounded. On the other hand, since only one side of the board becomes the mounting space of electronic components, this becomes a struggle of raising a degree of integration and functions of the IGBT drive and protection circuit.

As described above, a power supply of an IGBT drive and protection circuit cannot be integrated with an intelligent module in a conventional apparatus due to problems of heat generation and switching noise of a semiconductor device, and a board mounting space. Hence, there is a disadvantage that it is not possible to miniaturize an electric power conversion apparatus, and in extension, an inverter apparatus itself.

BRIEF SUMMARY OF THE INVENTION

This invention is achieved to solve the above problems, and its object is to provide an electric power conversion apparatus that is miniaturized and reduced in weight by integrating not only an IGBT drive and protection circuit but also a power supply circuit for supplying power into a conventional intelligent module which is an electric power conversion circuit. That is, its object is not only to perform the miniaturization and weight reduction of the inverter apparatus, but also to obtain an electric power conversion apparatus that is highly reliable, sophisticated, and excellent in safety, by mixedly arranging the power supply circuit and other functions in the electric power conversion apparatus, i.e., a conventional intelligent module.

The above-described power supply circuit is prepared for every reference electric potential of each IGBT device, and is electrically insulated completely from a low voltage power supply system. Therefore, it becomes possible to collect a high voltage system in an intelligent module by integrating a power supply circuit into an electric power conversion apparatus. Hence, since it is electrically separable from a low voltage power supply system, it is possible to provide ideal configuration in a safety aspect for applications in an electric motorcar etc.

In addition, another object is to provide an electric power conversion apparatus with not only a conventional IGBT drive and protective function, but also diagnostic functions such as an alarm signal and failure history, and a high value-added function such as trimming adjustment of a semiconductor device protection circuit for electric power conversion by mixedly mounting not only the above-described power supply circuit, but also a digital control circuit using a microcomputer through increasing an electronic component mounting space by implementing the multilayer structure and double-sided mounting of a board in the electric power conversion apparatus.

An electric power conversion apparatus according to the present invention is an apparatus where, in an inverter apparatus which converts a DC voltage into an AC voltage, a semiconductor device for electric power conversion, drive and protection means for driving and protecting the semiconductor device for an electric power conversion, and a power circuit supplying electric power to the drive and protection means are integrated in one module.

The electric power conversion apparatus according to the present invention is an apparatus where the drive and protection means and the power circuit are mixedly mounted on both sides of a board, and a metal shielding plate is arranged between the board and the semiconductor device for electric power conversion.

The electric power conversion apparatus according to the present invention is an apparatus where a board on which the drive and protection means and the power circuit are mixedly mounted is made to be a multilayer board, and heat generated in an inner layer pattern of the board is made to be radiated through the metal shielding plate to a base plate connected to an external cooler.

The electric power conversion apparatus according to the present invention an apparatus where a low profile type sheet transformer made by combining ferrite core material and a multilayer board is used as a switching transformer in the power circuit.

The electric power conversion apparatus according to the present invention is an apparatus where the drive and protection means includes a diode device incorporated in the semiconductor device for electric power conversion, a constant current circuit which gives a constant current to the diode device, an waveform shaping circuit which shapes a waveform of a voltage between both ends of the diode device, and a microcomputer which fetches a voltage between both ends of the diode device whose waveform is shaped, and where the semiconductor device for electric power conversion is shut off on the basis of the voltage between both ends of the diode device, which is fetched, and overheat determination temperature data stored beforehand.

The electric power conversion apparatus according to the present invention is an apparatus where the microcomputer has correcting operation means for performing correcting operation of a temperature map at the time of product shipment, and storing the overheat determination temperature data beforehand, interpolating operation means for performing interpolating operation on the basis of the overheat determination temperature data and a detection output of a temperature detecting element on a board during normal operation.

The electric power conversion apparatus according to the present invention is an apparatus where the drive and protection means includes a sensing terminal which takes out a shunt current of the semiconductor device for electric power conversion, conversion means for converting the shunt current into a voltage, and short-circuit current detection means for comparing a voltage from the conversion means with a voltage equivalent to a short-circuit current of the semiconductor device for electric power conversion, and where the semiconductor device for electric power conversion is shut off on the basis of the comparison result of the short-circuit current detection means.

The electric power conversion apparatus according to the present invention is an apparatus where the drive and protection means includes a sensing terminal which takes out a shunt current of the semiconductor device for electric power conversion, conversion means for converting the shunt current into a voltage, overcurrent detection means for comparing a voltage from the conversion means with a voltage equivalent to an overcurrent of the semiconductor device for electric power conversion, and where di/dt of the semiconductor device for electric power conversion is suppressed without shutting off switching operation on the basis of comparison result of the overcurrent detection means.

The electric power conversion apparatus according to the present invention is an apparatus where the drive and protection means includes gate short-circuit detection means for comparing a logic level of a gate input signal for driving the semiconductor device for electric power conversion with a logic level of a gate terminal voltage of the semiconductor device for the electric power conversion, and where, if comparison result of the gate short-circuit detection means is negative, the semiconductor device for electric power conversion is shut off.

The electric power conversion apparatus according to the present invention is an apparatus where the drive and protection means includes gate voltage abnormality determination means for comparing a gate voltage of a gate of the semiconductor device for electric power conversion with a voltage for gate voltage abnormality determination, and where the semiconductor device for electric power conversion is shut off on the basis of comparison result of the gate voltage abnormality determination means.

The electric power conversion apparatus according to the present invention is an apparatus where the drive and protection means suppresses di/dt of the semiconductor device for electric power conversion when the semiconductor device is shut off.

The electric power conversion apparatus according to the present invention is an apparatus where, when the semiconductor device for electric power conversion is shut off, the drive and protection means simultaneously shuts off all the gate input signals of semiconductor devices other than the concerned semiconductor device, and also outputs to an external control unit what protective function shuts off the semiconductor device.

The electric power conversion apparatus according to the present invention is an apparatus further including a voltage dividing circuit which divides a high power supply voltage, a microcomputer which performs waveform shaping of a voltage divided by the voltage dividing circuit and performs A/D conversion processing, and performs map interpolating operation of the A/D converted value, output means for converting calculation result of the microcomputer into a voltage level on the basis of a low voltage power supply, and outputting it to an external control unit as a voltage value of a high voltage power supply.

The electric power conversion apparatus according to the present invention is an apparatus further including adjustment means for performing correcting operation of a voltage map before product shipment, and making A/D conversion map data of a divided voltage of a high power supply voltage stored in the microcomputer beforehand.

The electric power conversion apparatus according to the present invention is an apparatus where the microcomputer has overvoltage determination means for comparing overvoltage data, stored beforehand, with an A/D-converted value of a divided voltage of the high power supply voltage, and where, if exceeding an overvoltage level, with suppressing and shutting off di/dt of the semiconductor device for electric power conversion, the microcomputer outputs to an external control unit that the semiconductor device for the electric power conversion is shut off.

DETAILED DESCRIPTION OF THE PREFERRED EMBODIMENTS

Figure 18:
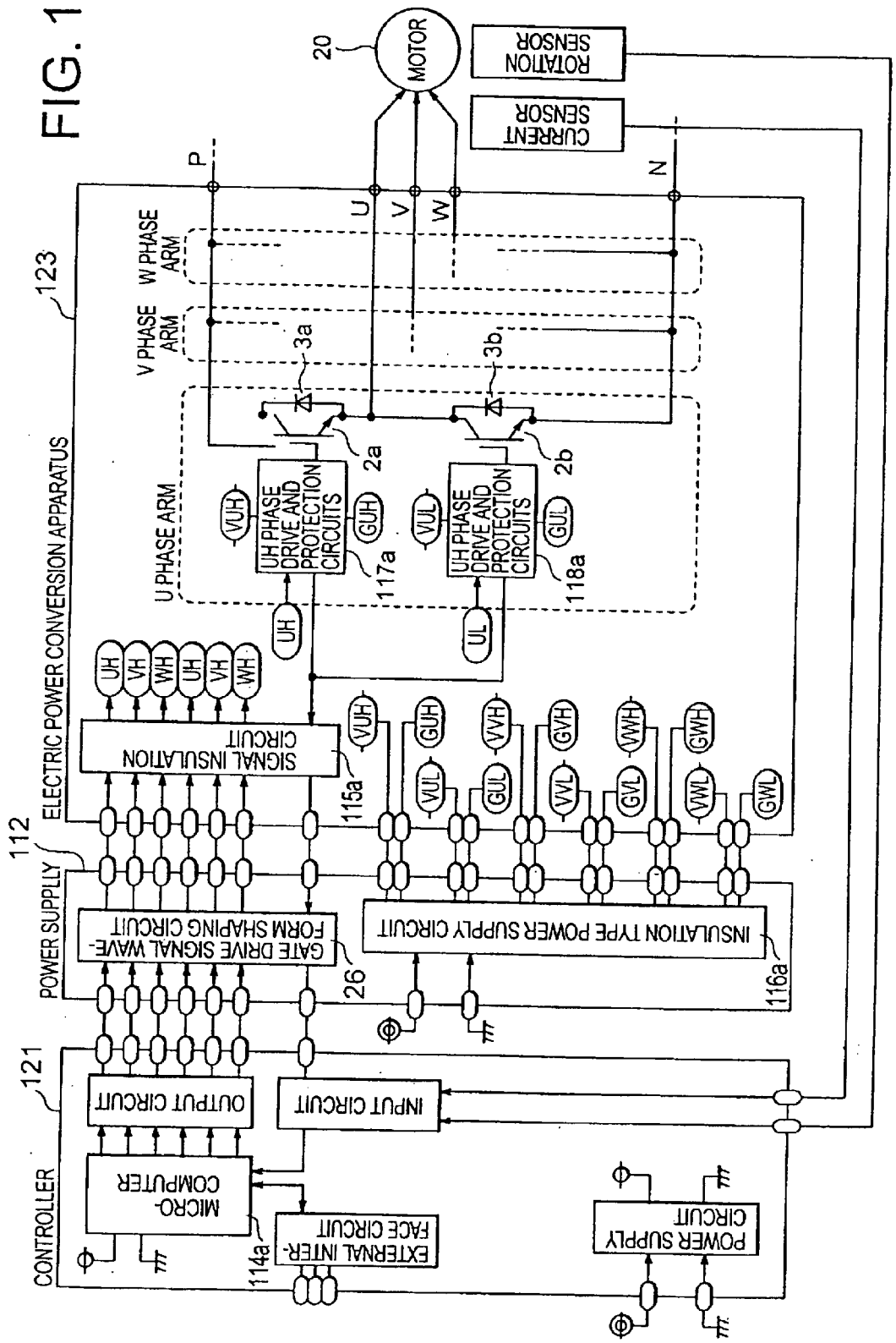
FIG. 18 is a block diagram showing a circuit configuration of an inverter apparatus including a conventional electric power conversion apparatus.

Hereafter, an embodiment of this invention will be described on the basis of drawings. In addition, the same symbols as those in FIG. 18 shows the same or corresponding portions in the drawings. In addition, the basic operation of an electric power conversion apparatus will be omitted since it is the same or similar to what is generally called an inverter. Nevertheless, about the notation of a semiconductor device for electric power conversion, a device which stands in a higher potential (P) side of a DC power input (between P-N in the drawing) is called an upper arm device, and a device which stands in a lower potential (N) side is called a lower arm device.

Embodiment 1

Figure 1:
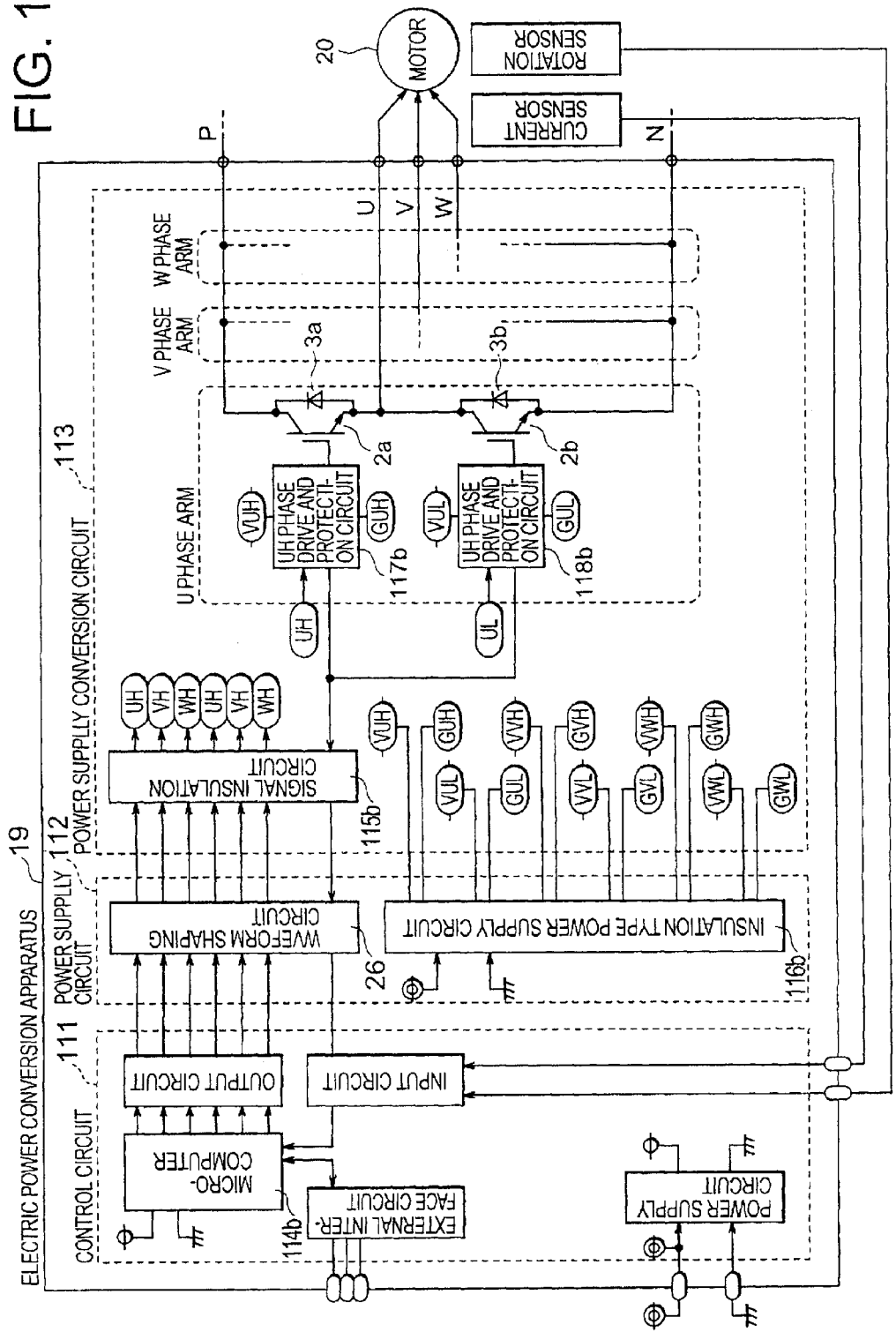
FIG. 1 is a block diagram showing a circuit configuration of an electric power conversion apparatus according to a first embodiment of the present invention.

FIG. 1 is a block diagram showing a circuit configuration of an electric power conversion apparatus according to a first embodiment of the present invention.

In FIG. 1, reference numeral 19 denoted an electric power conversion apparatus, reference numeral 20 denotes a three phase motor, reference numeral 111 denotes a control circuit including a microcomputer 114b etc., reference numeral 112 denotes a power supply circuit which includes a waveform shaping circuit 26 and an insulation type power supply circuit 116b, and supplies power to an IGBT drive and protection circuit board, and reference numeral 113 denotes an electric power conversion circuit including a signal insulation circuit 115b and a U phase arm which typically indicates only one phase of three phases. In addition, the U phase arm includes a UH phase drive and protection circuit 117b and a UL phase drive and protection circuit 118b as drive and protection means, and switching devices 2a and 2b and the free wheel diodes 3a and 3b as semiconductor devices for electric power conversion.

The microcomputer 114b of the control circuit 111 generates a switching signal on the basis of information from the external so as to drive the semiconductor devices for electric power conversion. This switching signal is electrically separated by the insulation type power supply circuit 116b and signal insulation circuit 115b from the low voltage power supply system where the microcomputer 114b operates, and is also transmitted to gate terminals of respective upper and lower arm devices in U, V, and W phases that are mutually separated electrically. Here, it is arbitrary whether the above-described switching signal is generated inside the electric power conversion apparatus 19 or it is given from an external controller not shown.

Figure 2:
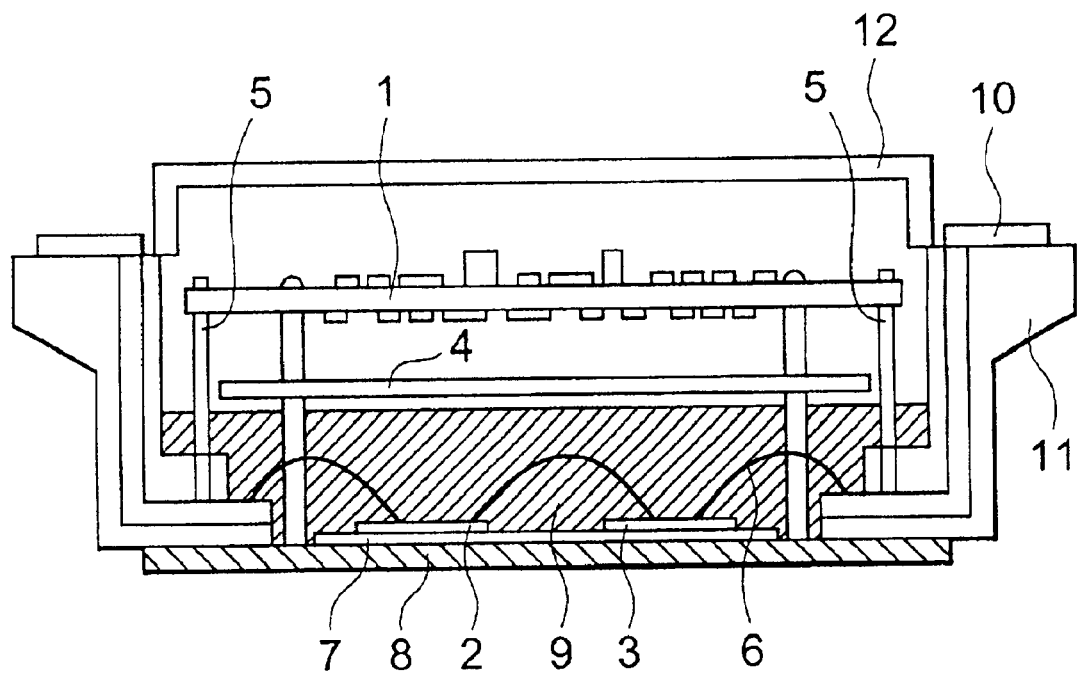
FIG. 2 is a side elevation showing an internal configuration of the electric power conversion apparatus according to the first embodiment of this invention.

FIG. 2 is a sectional view showing an internal configuration of the electric power conversion apparatus according to a first embodiment of this invention.

In FIG. 2, reference numeral 1 denotes a main board (hereinafter, only a PCB) where the control circuit 111, power supply circuit 112, electric power conversion circuit 113, or the like are mounted except the above-described semiconductor devices for electric power conversion (the switching devices 2 and free wheel diodes 3). In addition, reference numeral 4 denotes a metal shielding plate, reference numeral 5 denotes wiring for connecting the control circuit board, reference numeral 6 denotes a connecting conductor, reference numeral 7 denotes an insulated board, reference numeral 8 denotes a switching power module base plate, reference numeral 9 denotes a gel-like filler, reference numeral 10 denotes an electrode bus bar for external connection, reference numeral 11 denotes a switching power module case, and reference numeral 12 denotes a case.

A circuit for the driving and protecting semiconductor devices for electric power conversion, a power supply circuit which supplies power to this circuit for driving and protecting semiconductor devices, and an interface circuit for external connection (control circuit) are mounted on the PCB 1. Here, the PCB 1 does not restrain the difference between one-sided mounting and double-sided mounting of components, the quality of material of a board, geometry, etc. On the other hand, a semiconductor device is arranged through the insulated board 7, installed for the purpose of electric insulation, on the base plate 8 for forming the outline of a product and also connecting the semiconductor devices with a cooler not shown. In addition, in the case 11 the electrode bus bar 10 for external connection and the control circuit board connection wiring 5 are molded in one piece, and the case 11 is joined with the base plate 8. Furthermore, the semiconductor devices, electrode bus bar 10, and control circuit board connection wiring 5 are electrically connected by the connection conductor 6, and the PCB 1 is electrically connected by the control circuit board connection wiring 5.

Thus, in this embodiment, a power supply circuit which supplies power to a circuit for driving and protecting semiconductor devices for electric power conversion is mixedly mounted on a board in which the circuit for driving and protecting semiconductor devices is mounted, and the board is integrated with the semiconductor devices for electric power conversion in one module. Hence, it becomes possible to perform the miniaturization and weight reduction of an electric power conversion apparatus, and in extension, the miniaturization of the inverter apparatus itself. In addition, as long as being a semiconductor device for high-speed switching, the semiconductor device such as MOSFET other than an IGBT can be used as the semiconductor device for electric power conversion.

Embodiment 2

Figure 3:
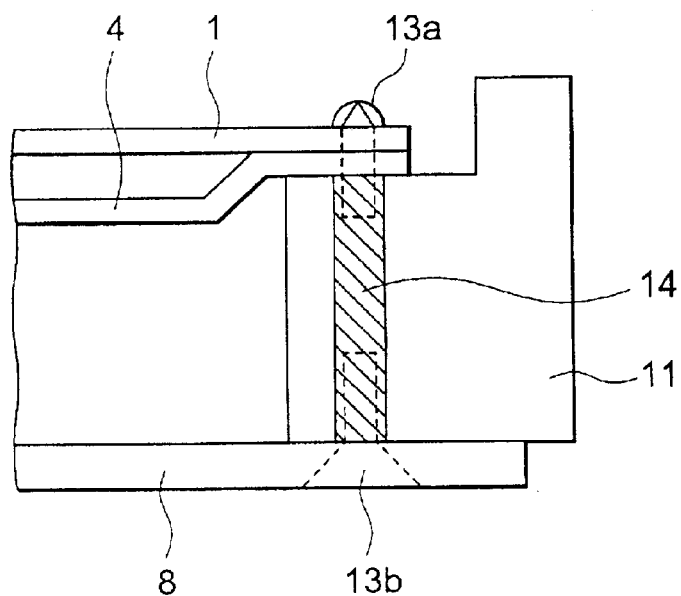
FIG. 3 is a sectional view showing an internal configuration of an electric power conversion apparatus according to a second embodiment of this invention.

FIG. 3 is a sectional view showing an internal configuration of an electric power conversion apparatus according to a second embodiment of this invention.

In addition to the configuration of the above-described first embodiment, for example as shown in FIG. 3, this embodiment is to together fasten the PCB1 and metal shielding plate 4 with using each screw 13a for fixing the PCB1 to the switching power module case 11, and to obtain electric connection with the metal shielding plate 4 and base plate 8 through each insert nut 14 molded with the switching power module case 11 in one piece.

That is, in order to secure a parts mounting space in the board, the board, i.e., PCB 1, where the circuit that drives and protects the semiconductor devices for electric power conversion, and the power supply circuit are mixedly mounted, is made to be a double-sided one. Hence, in order to obtain noise reduction effectiveness equal to or better than a fully-grounded pattern on the back face of the board that is conventional art, the metal shielding plate 4 (S side) with low permeability in a switching frequency band is arranged between the board and the semiconductor devices for electric power conversion is arranged.

Thus, in this embodiment, since the base plate 8 is used in a state where the base plate 8 is connected with the cooler not shown, it becomes possible to effectively reduce the influence of electromagnetic noise to the PCB 1 by stabilizing the cooler, which mainly consists of metal, in electric potential. Hence, the fully grounded pattern such as a conventional IGBT drive and protection circuit board becomes unnecessary. In consequence, it becomes easy to achieve the double-sided mounting of the PCB 1, and hence this contributes to the miniaturization of an apparatus.

Embodiment 3

In this embodiment, in addition to the above-described second embodiment, the PCB 1 is made to be substantially multilayer, and a fully-grounded pattern on an internal layer is connected with the base plate 8 electrically and thermally through the metal shielding plate 4 and the insert nut 14.

Thus, in this embodiment, a heavily heating component is made to radiate heat to the base plate 8 connected to an external cooler through an inner layer pattern and the metal shielding plate 4 by making a board, where a circuit which drives and protects semiconductor devices for electric power conversion, and a power supply circuit are mixedly mounted, be a multilayer board, connecting the inner layer pattern of the board to a lead portion of the heavily heating component, and together fastening the metal shielding plate 4 with the board through the inner layer pattern at multiple points. Hence, it is possible to improve the cooling effect of the PCB 1 and to suppress temperature rise inside the electric power conversion apparatus.

Embodiment 4

Figure 4:
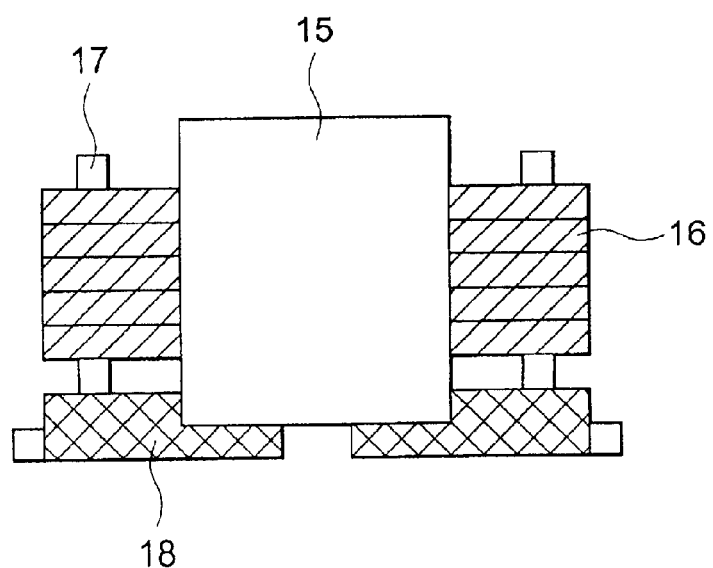
FIG. 4 is a side view showing a low profile type transformer used in an electric power conversion apparatus according to a fourth embodiment of the present invention.

FIG. 4 is a side elevation showing a low profile type transformer used for an electric power conversion apparatus according to a fourth embodiment of this invention.

This embodiment uses, for example, a low profile type sheet transformer, which has a form shown in FIG. 4 and is made by combining ferrite core material 15 and a multilayer board 16, as a switching transformer of a power supply circuit which supplies power to a circuit for driving and protecting semiconductor devices for electric power conversion.

Thus, in this embodiment, in order to perform the miniaturization and weight reduction of a power supply circuit which supplies power to a circuit for driving and protecting semiconductor devices for electric power conversion, a sheet transformer that complies with surface mount specifications and is made by combining ferrite core material and a multilayer board is provided instead of a bobbin core type transformer which is conventional art. Hence, since an insulation type power supply circuit in the low profile structure which can be used under an environment where antivibration conditions are severe, such as a vehicle-mounting application is constituted, it is possible not only to obtain a power supply with comparatively large capacity, but also to achieve the miniaturization and weight reduction.

Embodiment 5

Figure 5:
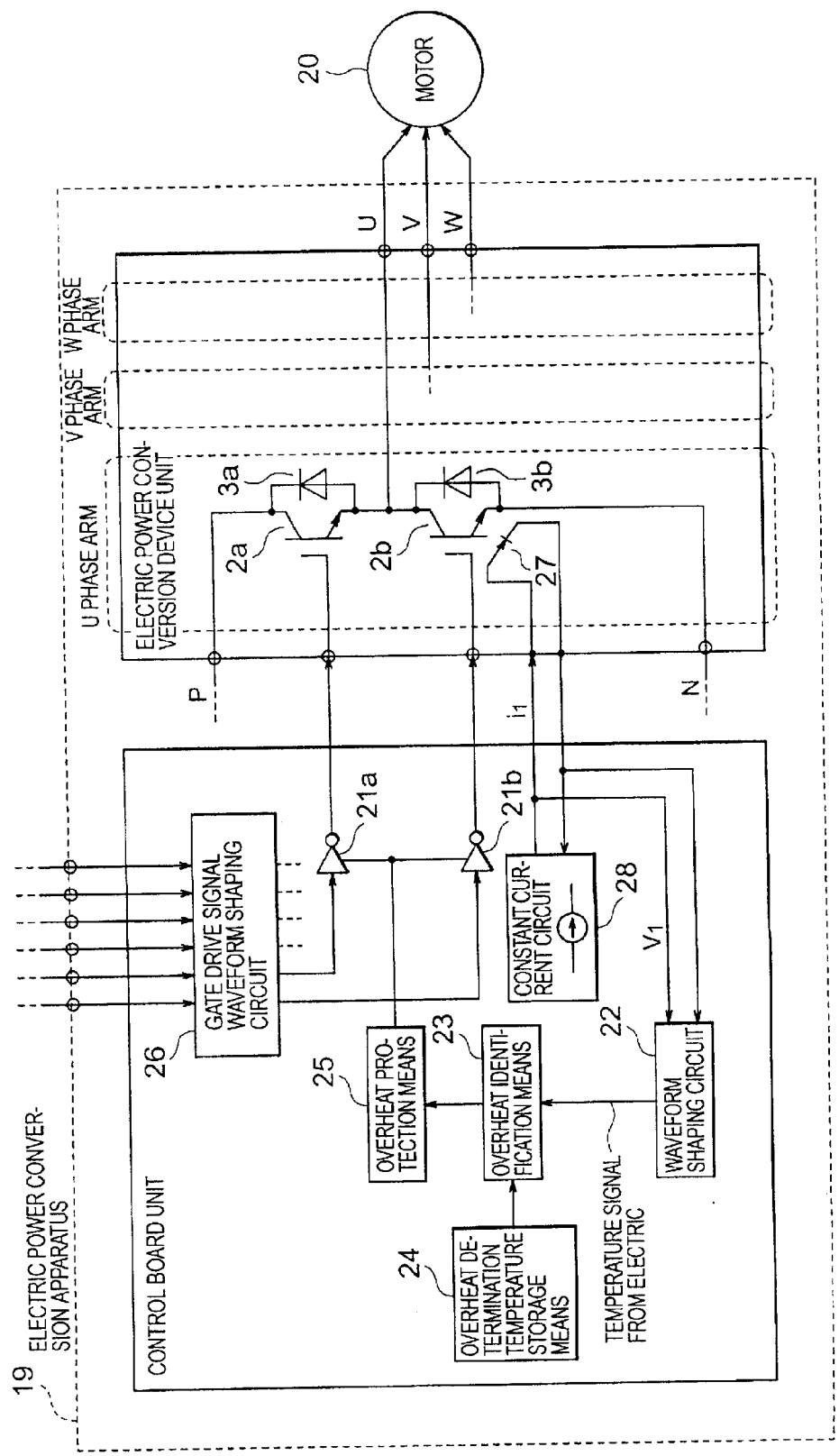
FIG. 5 is a block diagram showing a circuit configuration of an electric power conversion apparatus according to a fifth embodiment of this invention.

FIG. 5 is a block diagram showing a circuit configuration of an electric power conversion apparatus according to a fifth embodiment of this invention. In addition, in FIG. 5, the same numerals will be given to parts corresponding to those in FIG. 1, and the description on them will be omitted. In addition, here, a case that a switching signal for driving a semiconductor device for electric power conversion is given from an external controller not shown is described.

In this drawing, reference numerals 21a and 21b denote gate signal switching devices, reference numeral 22 denotes a waveform shaping circuit, reference numeral 23 denotes overheat identification means, reference numeral 24 denotes overheat determination temperature storage means, reference numeral 25 denotes overheat protection means, reference numeral 26 denotes a gate drive signal waveform shaping circuit, reference numeral 27 denotes a temperature detection diode, and reference numeral 28 is a constant current circuit. In addition, the gate signal switching devices 21a and 21b, and the gate drive signal waveform shaping circuit 26 substantially constitute a driving portion of drive and protection means, and circuits from the waveform shaping circuit 22 to the overheat protection means 25 substantially constitute a protection portion of the drive and protection means. In addition, the overheat identification means 23, the overheat determination temperature storage means 24, and the overheat protection means 25 constitute a microcomputer.

Next, operation will be described.

When current is flown by electric power conversion operation (switching) to the semiconductor device 2 or 3 for electric power conversion, heat is generated by the internal loss of the semiconductor devices. If the semiconductor device generates heat too much, there is a possibility that the device may be broken due to overheat. Therefore, the overheat identification means 23 detects the temperature of the semiconductor device, and determines whether a gate signal is shut off (gate cut) for overheat protection. If determining to perform the gate cut, the overheat identification means 23 transmits a signal to the overheat protection means 25. The overheat protection means 25 receives this signal, and shuts off the transfer of the gate signal from the gate drive signal waveform shaping circuit 26 to the semiconductor devices 2a and 2b with controlling the gate signal switching devices 21a and 21b.

Temperature detection of the semiconductor devices in the overheat identification means 23 is specifically made as follows. First, as a temperature sensor for the semiconductor devices, a temperature detection diode 27 is formed and arranged on the same board as the semiconductor devices. The constant current circuit 28 is connected to the temperature detection diode 27. A fixed current "if" which flows from the constant current circuit 28 flows into an anode of the temperature detection diode 27, and flows out from a cathode. The flowing current at this time is called a forward current from the polarity at the time of flowing into the temperature detection diode 27. In addition, the potential difference generated between the anode and cathode of the temperature detection diode 27 is called forward voltage Vf. An overheat identification means 23 inputs the forward voltage Vf through the waveform shaping circuit 22 connected to the anode and cathode of the temperature detection diode 27.

Figure 6:
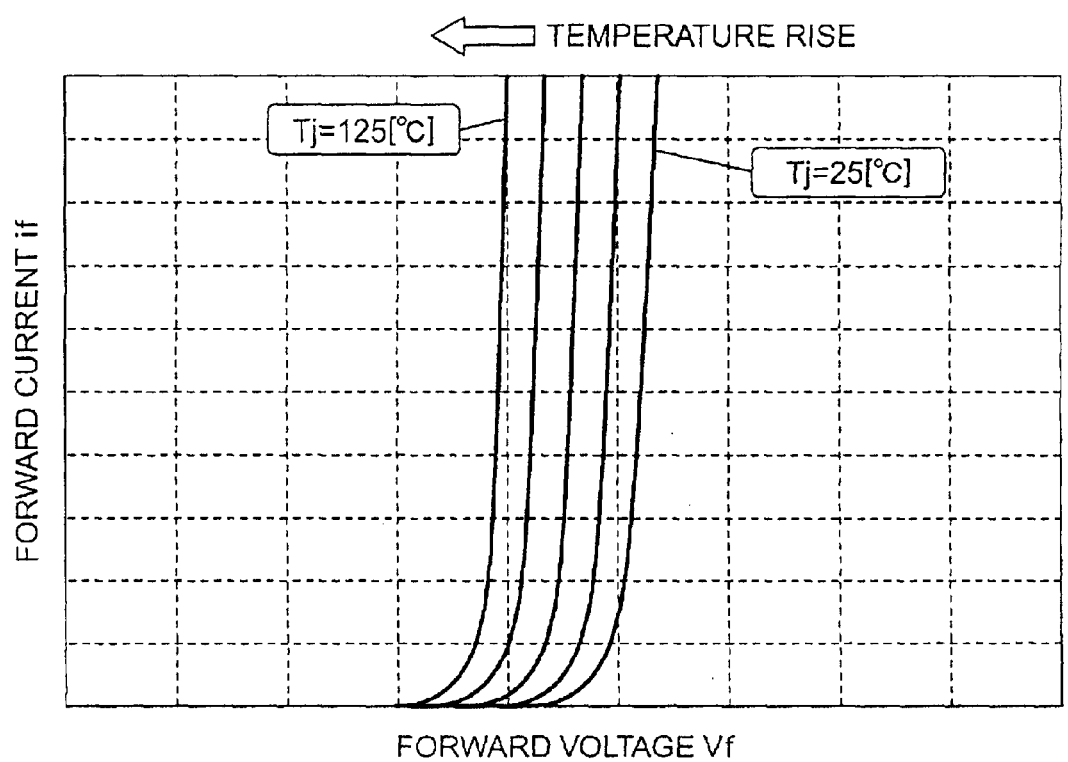
FIG. 6 is a graph showing examples of Vf-if characteristics of diodes for temperature detection used for the electric power conversion apparatus according to the fifth embodiment of this invention.

Here, between the forward voltage Vf of a diode, and the forward current "if", the characteristic shown in FIG. 6 holds because of physical property. Thus, depending on the junction temperature Tj of the diode, the forward voltage Vf to the forward current "if" varies. The direction of the variation is the direction of lowering the forward voltage Vf to the rise of the junction temperature Tj.

Figure 7:
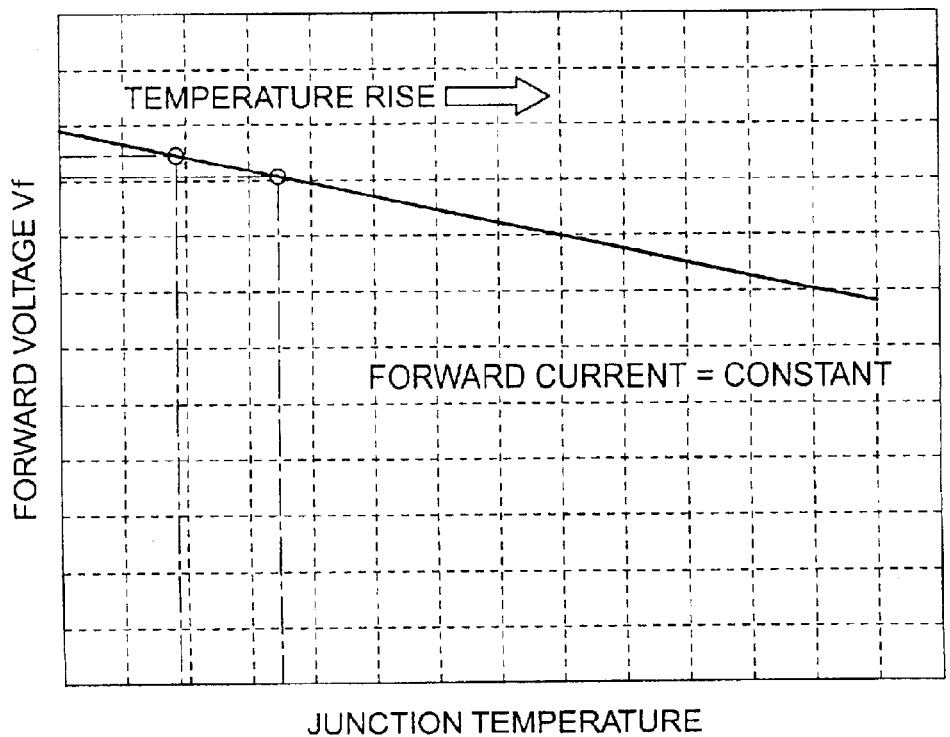
FIG. 7 is a graph showing examples of Tj-Vf characteristics of diodes for temperature detection used for the electric power conversion apparatus according to the fifth embodiment of this invention.

In addition, the forward voltage Vf at the time when the fixed forward current "if" flows in a diode has the characteristic shown in FIG. 7 to the junction temperature Tj. Thus, the forward voltage Vf decreases to the junction temperature Tj rising. Therefore, if the variation of the forward voltage Vf of the diode by which a fixed forward current is flown is read, a change of the junction temperature Tj of the diode is detectable.

That is, the overheat identification means 23 inputs the forward voltage Vf of the temperature detection diode 27, and recognizes the variation of the junction temperature Tj of the temperature detection diode 27. At this time, by forming the temperature detection diode 27 near the semiconductor device and setting the magnitude of the forward current "if" of the temperature detection diode 27 at the low value at which the diode itself does not overheat, it is possible to read the junction temperature Tj of the temperature detection diode 27 as the junction temperature of the semiconductor device. The overheat identification means 23 determines whether overheat protection should be performed, by comparing the junction temperature Tj with the overheat determination temperature beforehand stored in the overheat determination temperature storage means 24.

Although a temperature sensing element such as a thermistor is stuck on an insulated board in conventional technology, this embodiment has an on-chip temperature sensor using the temperature-Vf characteristic of a diode device incorporated on a semiconductor device as an overheat protective function of the semiconductor device for electric power conversion in this manner. In addition, by constituting the temperature sensor for the semiconductor device for electric power conversion which has a minimum temperature difference from the core temperature of the semiconductor device for electric power conversion and is excellent in the temperature followingness, this embodiment realizes a highly precise overheat protective function by interpolating operation means in a microcomputer. That is, by flowing a fixed forward current in the diode formed on the same board that the semiconductor device for electric power conversion is formed, and reading the forward voltage of the diode, it becomes possible to recognize the temperature of the semiconductor device. Since this temperature detection responses far quickly than temperature detection by a thermistor conventionally used, it becomes possible to improve the overheat protection characteristic of the semiconductor device by detecting the temperature rise of the semiconductor device with sufficient accuracy in a short time.

Embodiment 6

Figure 8:
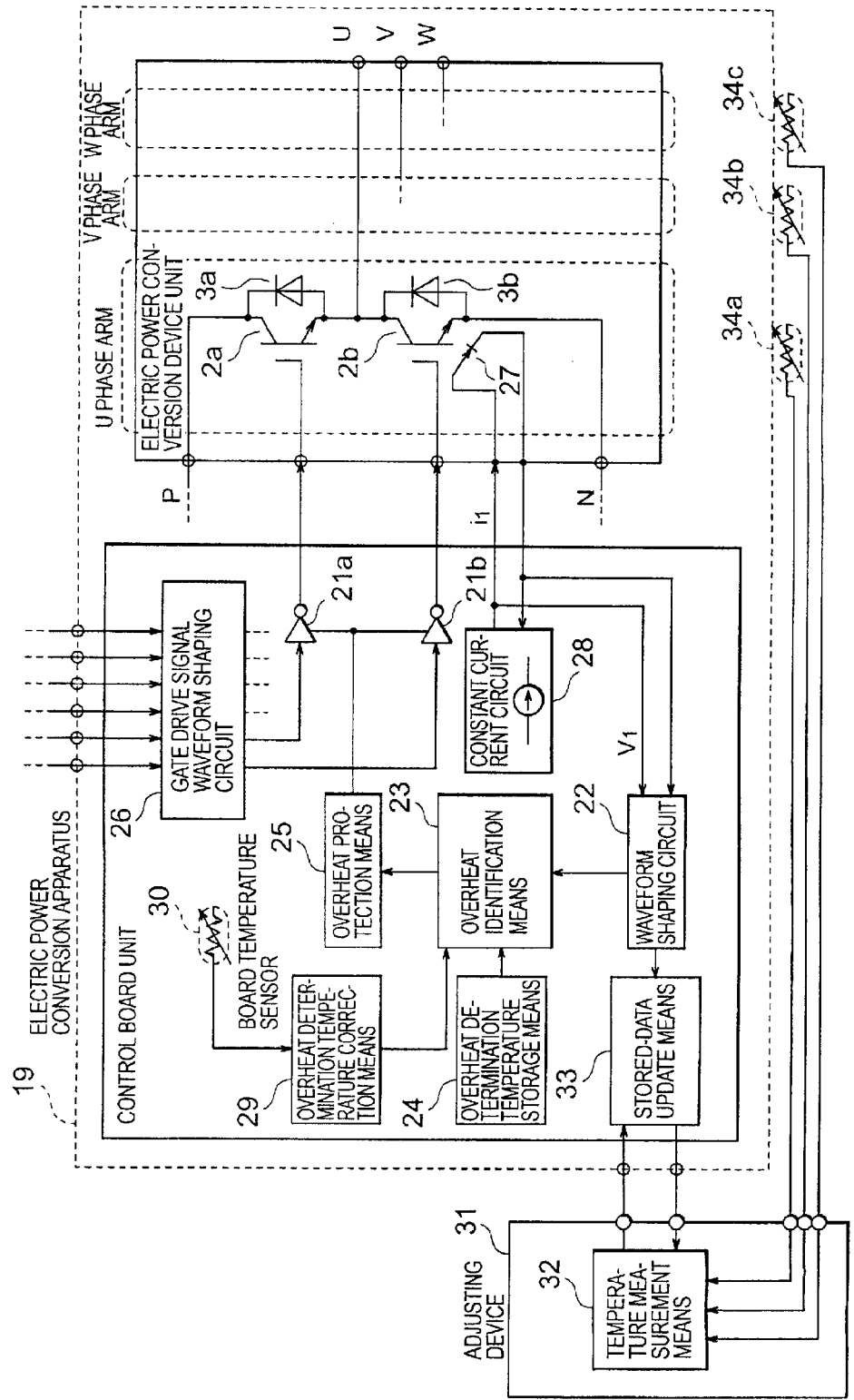
FIG. 8 is a block diagram showing a circuit configuration of an electric power conversion apparatus according to a sixth embodiment of this invention.

FIG. 8 is a block diagram showing a circuit configuration of an electric power conversion apparatus according to a sixth embodiment of this invention. In addition, in FIG. 8, the same numerals will be given to parts corresponding to those in FIG. 5, and the description on them will be omitted.

In the drawing, reference numeral 29 denotes overheat determination temperature correction means as interpolating operation means, reference numeral 30 denotes a board temperature sensor, reference numeral 31 denotes an adjusting device, reference numeral 32 denotes temperature measurement means, reference numeral 33 denotes stored-data update means as correcting operation means, and reference numeral 34 denotes a surface temperature sensor.

The adjusting device 31 is one of testing equipment connected at an outgoing inspection step of the electric power conversion apparatus 19, and during test execution, exchanges information with the stored-data update means 33 with using the serial communication means not shown.

Figure 9:
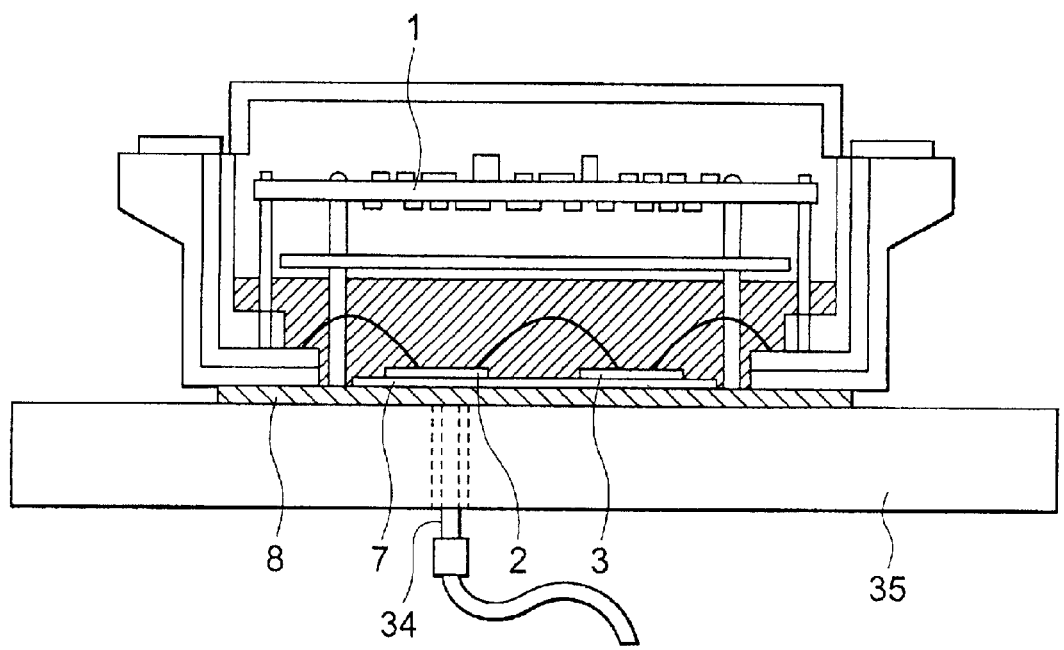
FIG. 9 is a side elevation showing an example of a method of detecting base plate temperature of the electric power conversion apparatus according to the sixth embodiment of this invention.

FIG. 9 is a side elevation showing an example of a method of detecting base plate temperature of the electric power conversion apparatus according to the sixth embodiment of this invention.

In the drawing, reference numeral 34 denotes surface temperature sensors, which are equivalent to the sensors 34a, 34b, and 34c in FIG. 8. The surface temperature sensors 34 are respectively arranged so that the temperature of the base plate 8 just under portions, where the maximum temperature of the semiconductor devices 2 in the lower arm side which incorporate the temperature detection diodes 27 for respective U, V, and W phases, can be measured. Reference numeral 35 denotes a test instrument tool where a heater that is not shown and uniformly warms the base plate 8 of the electric power conversion apparatus 19 is incorporated. The test instrument tool is controlled for temperature so that the semiconductor devices 2 may become constant temperature by the adjusting device 31. In the electric power conversion apparatus 19 that becomes an object of the test, correlation with the temperature of the base plate 8 and the junction temperature of the semiconductor devices 2 is managed separately. Although the method of managing temperature correlation is omitted, the learning adjustment step in the test step at the time of shipping this product is performed two times under ordinary temperature and elevated temperature to all the U, V, and W phases.

In FIG. 8, a method of operating temperature map correction will be described in the case of the U phase arm.

First, by the temperature measurement means 32, the adjusting device 31 reads the temperature Tcold of the surface temperature sensor 34a under the ordinary temperature, and transmits temperature information to the stored-data update means 33 of the electric power conversion apparatus 19 with combining the temperature Tcold with the information on phase identification. The stored-data update means 33 stores the temperature Tcold of the base plate 8 and the forward voltage Vfcold of the temperature detection diode 27, which are transmitted from the adjusting device 31.

Next, the temperature Thot of the surface temperature sensor 34a under the elevated temperature is read, and temperature information is similarly transmitted to the stored-data update means 33. The stored-data update means 33 obtains the temperature Thot of the base plate 8 and the forward voltage Vfhot of the temperature detection diode 27, which are transmitted from the adjusting device 31, and obtains the following gradient (dT/dV) of the Tj-Vf characteristic of the U phase arm from these four parameters.

$$dT/dV=(Thot-Tcold)/(Vfhot-Vfcold)$$

For example, it is apparent that the stored-data update means 33 can calculate the above-mentioned junction temperature Tj from the forward voltage Vf of the temperature detection diode 27, which is read in the normal operation, with using the following formula by making the overheat determination temperature storage means 24 store the above-described Tcold, Vfcold, and dT/dV.

$$Tj=(Vf-Vfcold)\times(dT/dV)+Tcold$$

Furthermore, the board temperature sensor 30 for measuring the temperature of the board (PCB 1) is mounted in the PCB 1 of the electric power conversion apparatus 19, which the overheat determination temperature correction means 29 reads as temperature information. During the usual operation, the overheat determination temperature correction means 29 measures the temperature on the board, calculates the variation amount of the above-mentioned dT/dV as an operation multiplier Kd from a temperature drift correction map for the on-board electronic components which will not be described here and is stored beforehand, corrects the above-mentioned junction temperature Tj with the following formula, and obtains highly precise junction temperature Tj'.

$$Tj'=Tj\times Kd$$

Thus, in this embodiment, in order to correct the characteristic dispersion of the temperature detection diode 27 as a diode device, by storing beforehand a Vf voltage of the diode device under conditions of the ordinary temperature and elevated temperature in the microcomputer in the electric power conversion apparatus at the time of product shipment, performing the interpolating operation of the actual device temperature from its gradient (dT/dV), and further making a value of the temperature sensing element on the board (for example, thermistor) coefficient-operated for the temperature drift correction of on-board electronic components, it becomes possible to detect temperature highly precisely even under the environment of a wide temperature range like a vehicle-mounted application.

Embodiment 7

Figure 10:
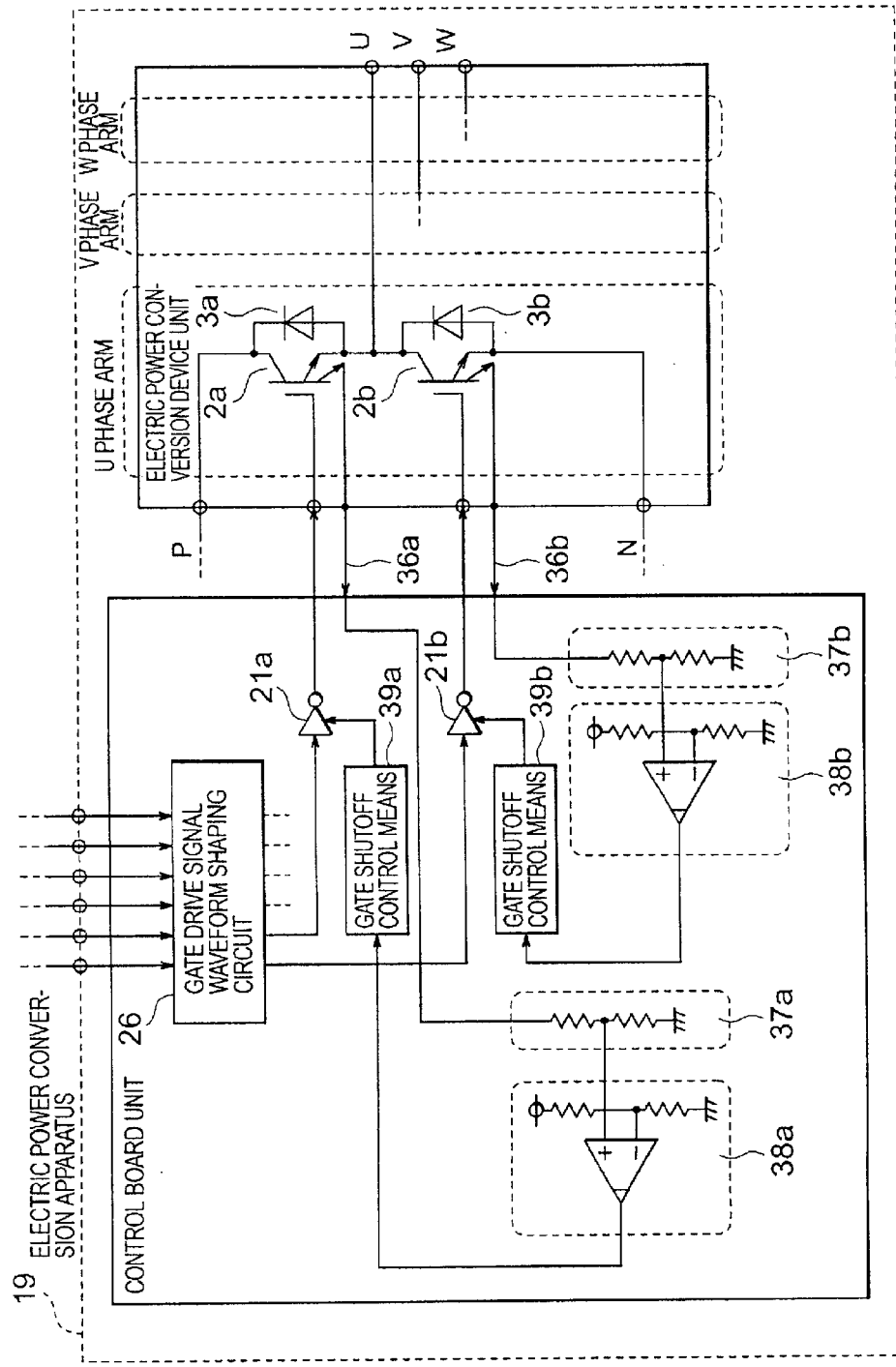
FIG. 10 is a block diagram showing a circuit configuration of an electric power conversion apparatus according to a seventh embodiment of the present invention.

FIG. 10 is a block diagram showing a circuit configuration of an electric power conversion apparatus according to a seventh embodiment of this invention. In addition, in FIG. 10, the same numerals will be given to parts corresponding to those in FIG. 5, and the description on them will be omitted.

In the drawing, reference numerals 36a and 36b denote sensing terminals for taking out shunt currents of the semiconductor devices, reference numerals 37a and 37b are current-voltage conversion circuits as conversion means, reference numerals 38a and 38b are short-circuit current detection circuits as short-circuit current detection means of comparing the shunt currents with the voltage value equivalent to the short-circuit current, and reference numerals 39a and 39b are gate cut control circuits as gate cut control means, which manages gate cut timing and shutoff execution time, at the time of short-circuit current detection.

Thus, in this embodiment, it is possible to prevent the breakdown of the concerned semiconductor device beforehand and to protect the semiconductor device from the short-circuit current by monitoring the terminal of a shunt current of a current, which flows in the semiconductor device, by focusing that the semiconductor device for electric power conversion has parallel arrangement inside its chip due to the configuration of an IGBT or an MOSFET device, and by shutting off the gate control signal of the semiconductor device concerned at the time of short-circuit current generating.

Embodiment 8

Figure 11:
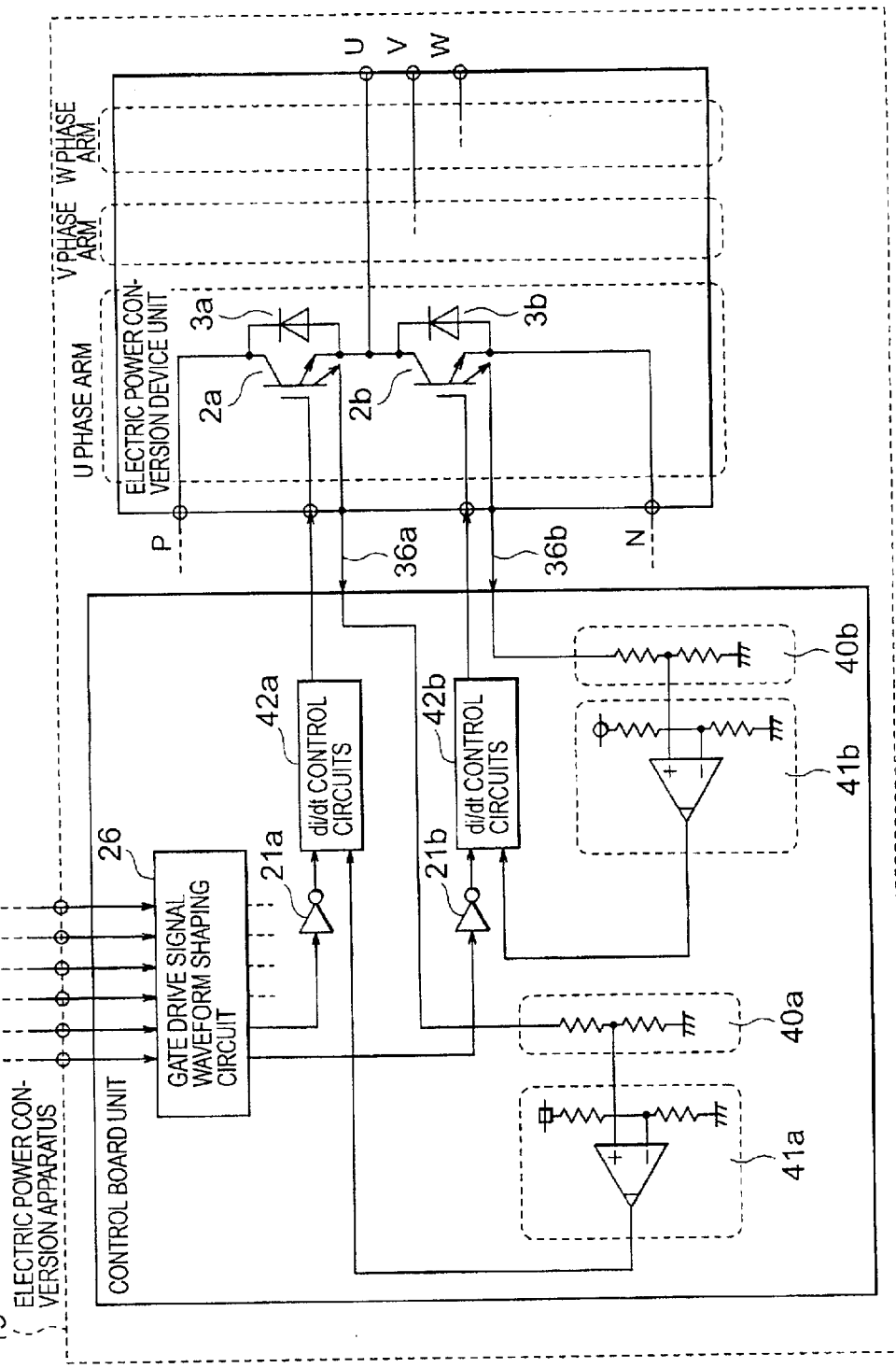
FIG. 11 is a block diagram showing a circuit configuration of an electric power conversion apparatus according to an eighth embodiment of this invention.

FIG. 11 is a block diagram showing a circuit configuration of an electric power conversion apparatus according to an eighth embodiment of this invention. In addition, in FIG. 11, the same numerals will be given to parts corresponding to those in FIG. 5, and the description on them will be omitted.

In the drawing, reference numerals 36a and 36b denote sensing terminals for taking out shunt currents of the semiconductor devices similarly to the above, and reference numerals 40a and 40b denote current-voltage conversion circuits as conversion means, which may be also used as the above-described current-voltage conversion circuit 37. Reference numerals 41a and 41b denote overcurrent detection circuits as overcurrent detection means of comparing them with voltage values equivalent to an overcurrent, and reference numerals 42a and 42b denote di/dt control circuits which dull the current interception velocity of the semiconductor devices at the time of overcurrent detection.

Next, with reference to FIG. 12, di/dt control will be described by taking IGBT drive as an example.

Figure 12:
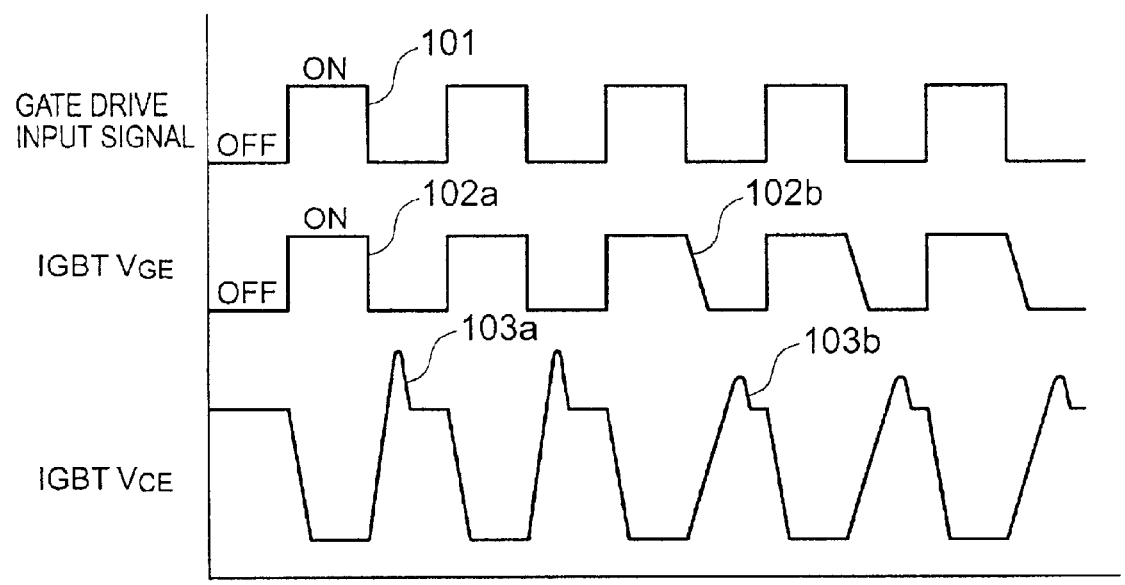
FIG. 12 includes examples of operating waveforms of the electric power conversion apparatus according to the eighth embodiment of this invention.

In FIG. 12, reference numeral 101 denotes, for example, a gate drive command signal after waveform shaping that is outputted from the gate signal output means shown in FIG. 11, i.e., the gate drive signal waveform shaping circuit 26. Reference numerals 102a and 103a denote an IGBT gate voltage waveform and a collector-emitter voltage waveform at the time of di/dt control not operating. Similarly, reference numerals 102b and 103b denote an IGBT gate voltage waveform and an collector-emitter voltage waveform at the time of di/dt control operating.

Generally, it is required that the gate drive command signal 101 has variation speed as fast as possible to an IGBT gate in many cases for the purpose of loss reduction by making the switching frequency high. On the other hand, since the variation speed of a gate drive command, i.e., the variation speed of a collector current appears as a switching surge voltage by the product with an inductance component which exists on a path of the collector current, the variation speed of a collector current is restricted by a withstand voltage of the semiconductor device, the withstand voltages of other electronic components which are attached on the same system. Therefore, the variation speed of the gate drive command signal is prescribed by characteristics of the semiconductor device and the configuration of an applied system.

A di/dt control function is activated by the overcurrent detection circuit 41 detecting that the collector current increases under the above-mentioned short circuit detection current and beyond the specified value, and dulls the off speed of the gate drive signal like the signal 102b. Thereby, the shutoff speed of the collector current and the return speed 103b of the collector-emitter voltage also become dull. The switching surge voltage proportional to the product of a current variation speed and a current path inductance as a result is reduced, and an excess of a withstand voltage by the surge voltage rise at the time of overcurrent is prevented.

Thus, in this embodiment, it becomes possible to suppress a surge voltage generated at the time of switching and to prevent the excess of the withstand voltage due to the rise of the surge voltage at the time of overcurrent by monitoring the above-described shunt current as an overcurrent protective function of a semiconductor device for electric power conversion, switching a circuit so that the gate resistance of the semiconductor device may become large without shutting off the switching operation of the semiconductor device with limiting to a case that the shunt current is less than short-circuit current and more than the maximum current which flows in the semiconductor device, and suppressing di/dt.

Embodiment 9

Figure 13:
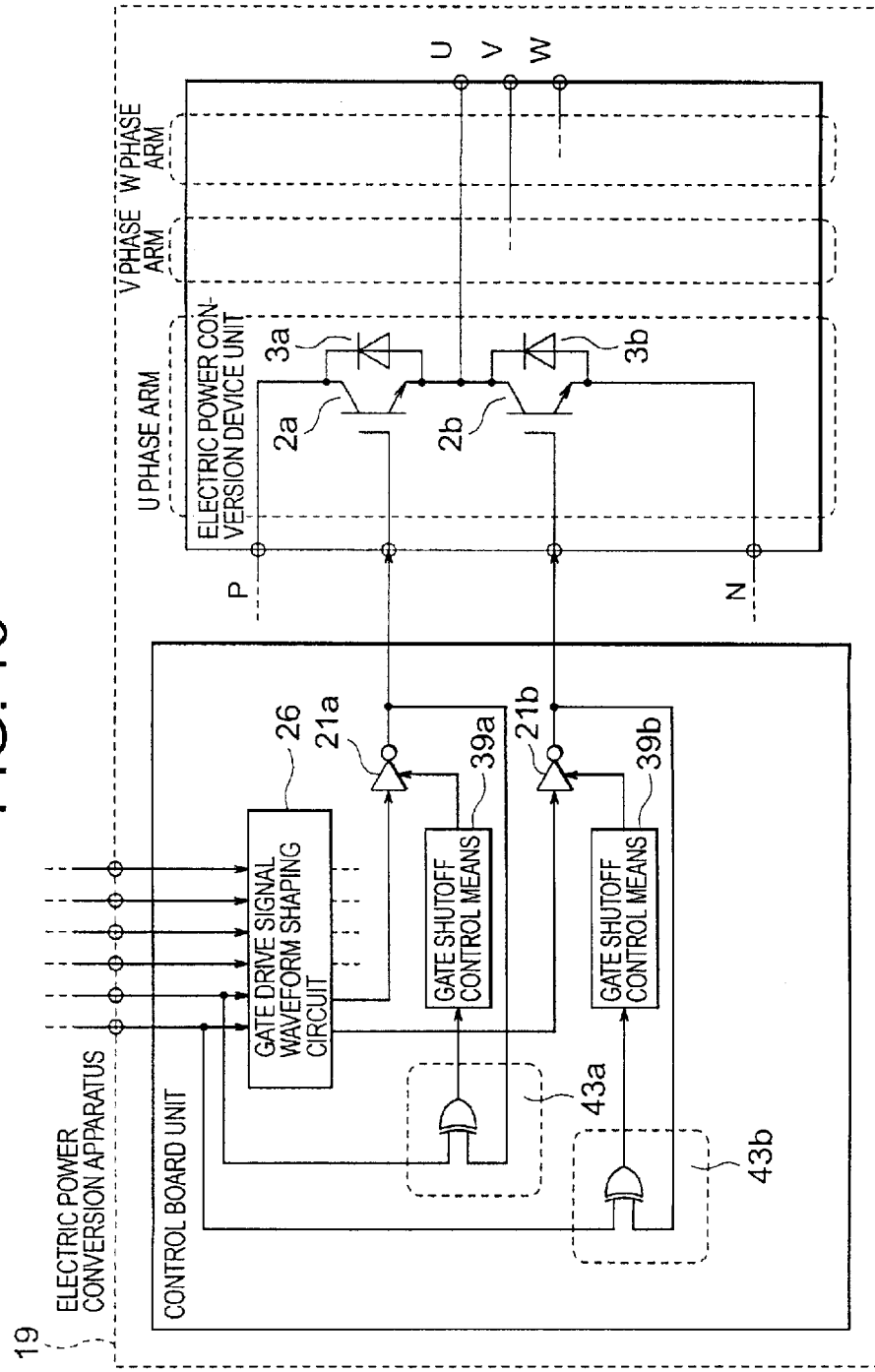
FIG. 13 is a block diagram showing a circuit configuration of an electric power conversion apparatus according to a ninth embodiment of this invention.

FIG. 13 is a block diagram showing a circuit configuration of an electric power conversion apparatus according to a ninth embodiment of this invention. In addition, in FIG. 13, the same numerals will be given to parts corresponding to those in FIG. 10, and the description on them will be omitted.

In the drawing, reference numerals 43a and 43b denote gate short-circuit detection circuits as gate short-circuit detection means which detects exclusive OR of logic levels of the inputted gate drive signal, and the gate terminal voltage of the semiconductor device, and if both logic levels differ from each other, the gate shutoff control means 39a and 39b shut off the gate control signal of the semiconductor device concerned.

Thus, in this embodiment, it becomes possible to prevent the breakdown of the semiconductor device concerned beforehand, as the gate signal short-circuit protection apparatus for an semiconductor device for electric power conversion, by comparing the voltage logic level of the gate input signal of a semiconductor device drive circuit, i.e., the gate drive signal from an external control unit with the voltage logic level of the gate terminal of the semiconductor device, and shutting off the semiconductor device if not coinciding, that is, shutting off the gate control signal of the semiconductor device concerned at the time of the gate short-circuit of the semiconductor device.

Embodiment 10

Figure 14:
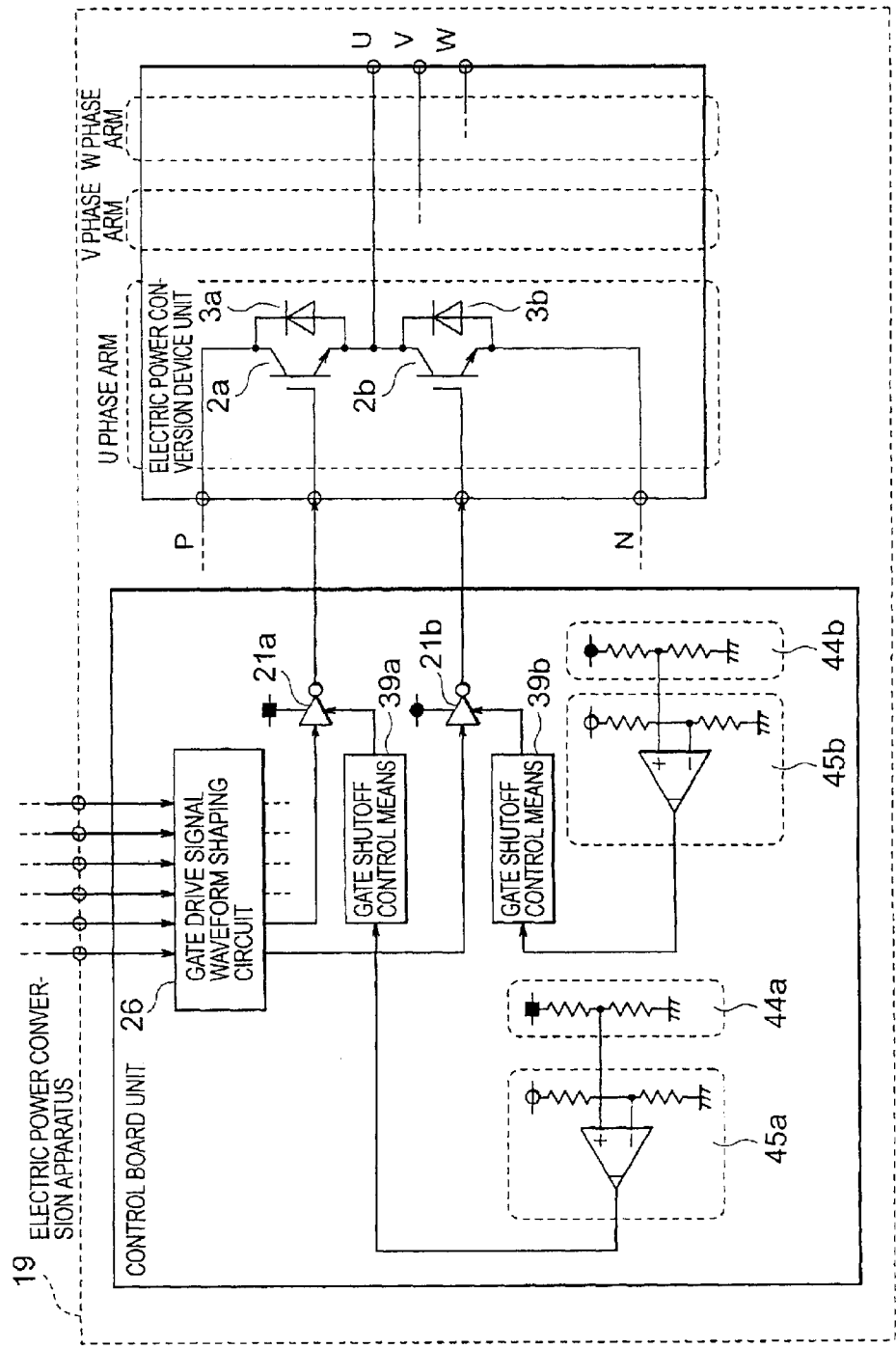
FIG. 14 is a block diagram showing a circuit configuration of an electric power conversion apparatus according to a tenth embodiment of the present invention.

FIG. 14 is a block diagram showing a circuit configuration of an electric power conversion apparatus according to a tenth embodiment of this invention. In addition, in FIG. 14, the same numerals will be given to parts corresponding to those in FIG. 10, and the description on them will be omitted.

In the drawing, reference numerals 44a and 44b denote gate voltage detecting circuits, and reference numerals 45a and 45b denote gate voltage abnormality determination circuits.

The gate voltages of the semiconductor devices are detected by the gate voltage detection circuits 44a and 44b, which are compared with the voltage for gate voltage abnormality determination set by the gate voltage abnormality determination circuit 45 as gate voltage abnormality determination means, and if abnormal, the current flow in the semiconductor device is shut off.

Thus, in this embodiment, it becomes possible to prevent the overvoltage breakdown of a gate if a power supply voltage for driving the gate of each semiconductor device generated in the power supply circuit exceeds a specified upper limit voltage as an abnormality of the gate voltage by monitoring whether the power supply voltage is lower or higher than a rated voltage, as a gate voltage abnormality protective function of the semiconductor device for electric power conversion, and it becomes possible to let performance deterioration caused by heat increase of the concerned semiconductor device known if the power supply voltage becomes lower than a specified minimum voltage.

Embodiment 11

In this embodiment, so as to prevent the overvoltage breakdown of the concerned semiconductor device which is caused by the surge voltage at the time of switching shutoff, by using together the di/dt control circuit, proposed in the above-described eighth embodiment, at the time of gate signal shutoff operation by any one of the overheat protective function proposed in the above-described fifth embodiment, the short-circuit current protective function proposed in the above-described seventh embodiment, and the gate short-circuit protective function proposed in the above-described ninth embodiment, the current shutoff speed of the semiconductor device concerned is dulled.

Thus, in this embodiment, it is possible to suppress the surge voltage at the time of shutoff by suppressing the di/dt of the semiconductor device through switching a circuit so that gate resistance of the semiconductor device may become large when the semiconductor device is shut off in all the protective functions for the semiconductor device for electric power conversion. Hence, it is possible to prevent beforehand the secondary calamity leading to the overvoltage breakdown of the device.

Embodiment 12

Figure 15:
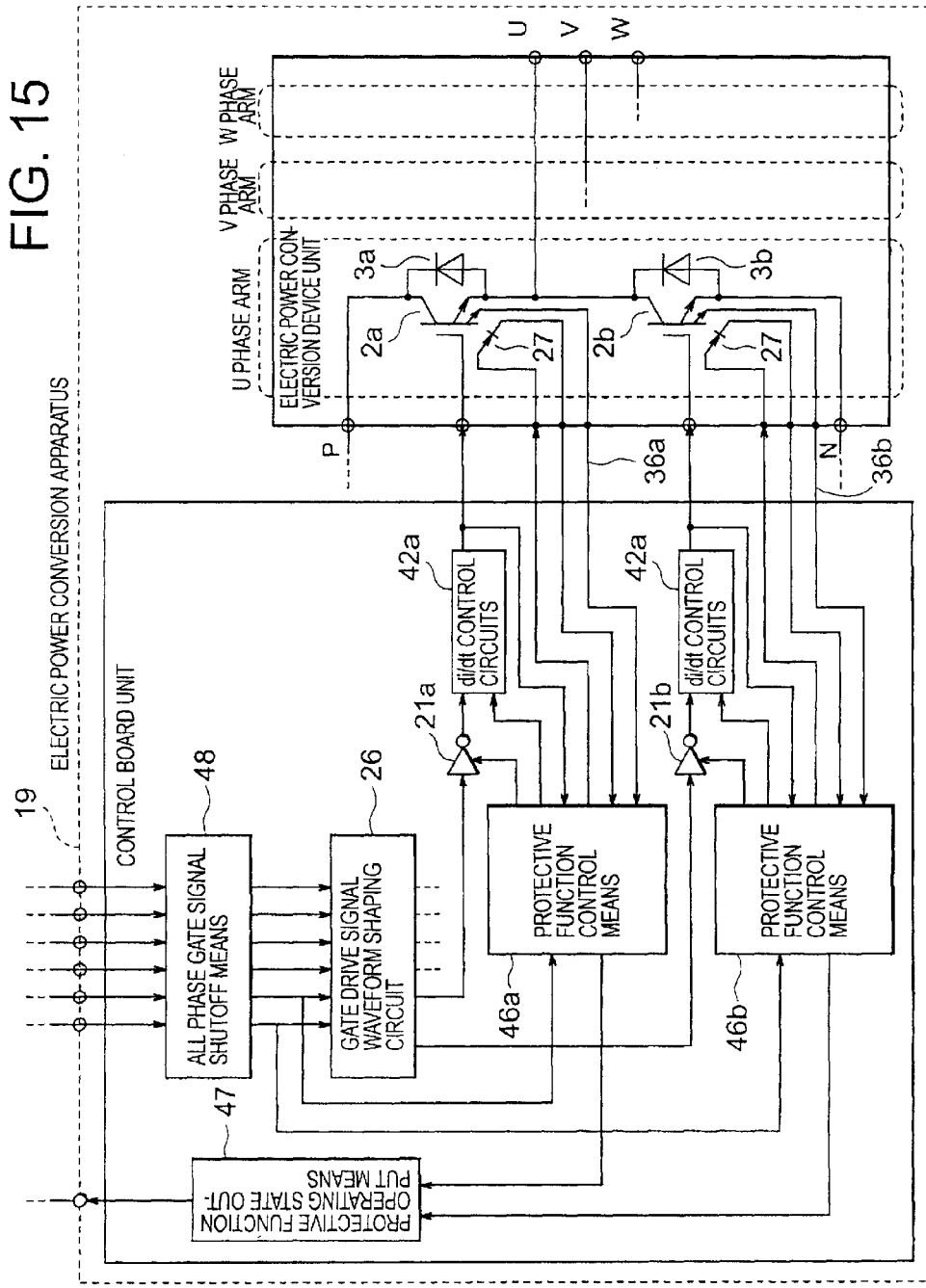
FIG. 15 is a block diagram showing a circuit configuration of an electric power conversion apparatus according to a twelfth embodiment of the present invention.

FIG. 15 is a block diagram showing a circuit configuration of an electric power conversion apparatus according to a twelfth embodiment of this invention. In addition, in FIG. 15, the same numerals will be given to parts corresponding to those in FIG. 11, and the description on them will be omitted.

In the drawing, reference numerals 46a and 46b denote protective function control means, reference numeral 47 denotes protective function operating state output means, and reference numeral 48 denotes all phase gate signal shutoff means. The protective function control means 46a and 46b include the overheat protective function shown in the above-described fifth embodiment, the short-circuit current protective function shown in the above-described seventh embodiment, the overcurrent protection function shown in the above-described eighth embodiment, and the gate short-circuit protective function shown in the above-described ninth embodiment.

If any one of the above-described protective functions operates and performs shutoff operation of the gate control signal of the corresponding phase, the protective function control means 46a and 46b transmit to the protective function operating state output means 47 which protective function is operating. The protective function operating state output means 47 has a function of outputting to an external control unit, which is not shown, what kind of a protective function shuts the semiconductor device while simultaneously shutting off the gate control signals of all phases by all phase gate signal shutoff means 48 except the phase where a gate control signal is shut off by the concerned protective function operating.

Thus, in this embodiment, in all the protective functions of the semiconductor device for electric power conversion, the gate input signals of all the semiconductor devices except the semiconductor device concerned is compulsorily shut off when any of the semiconductor device is shut off by a protective function, and it is outputted via serial communication or in a logic signal or the like that is converted into a voltage level on the basis of a low voltage power supply reference to an external control unit that any one of the semiconductor devices is shut off. Hence, it is possible to protect the electric power conversion apparatus, and in extension, the whole inverter apparatus, and hence, to prevent a secondary calamity beforehand.

Embodiment 13

Figure 16:
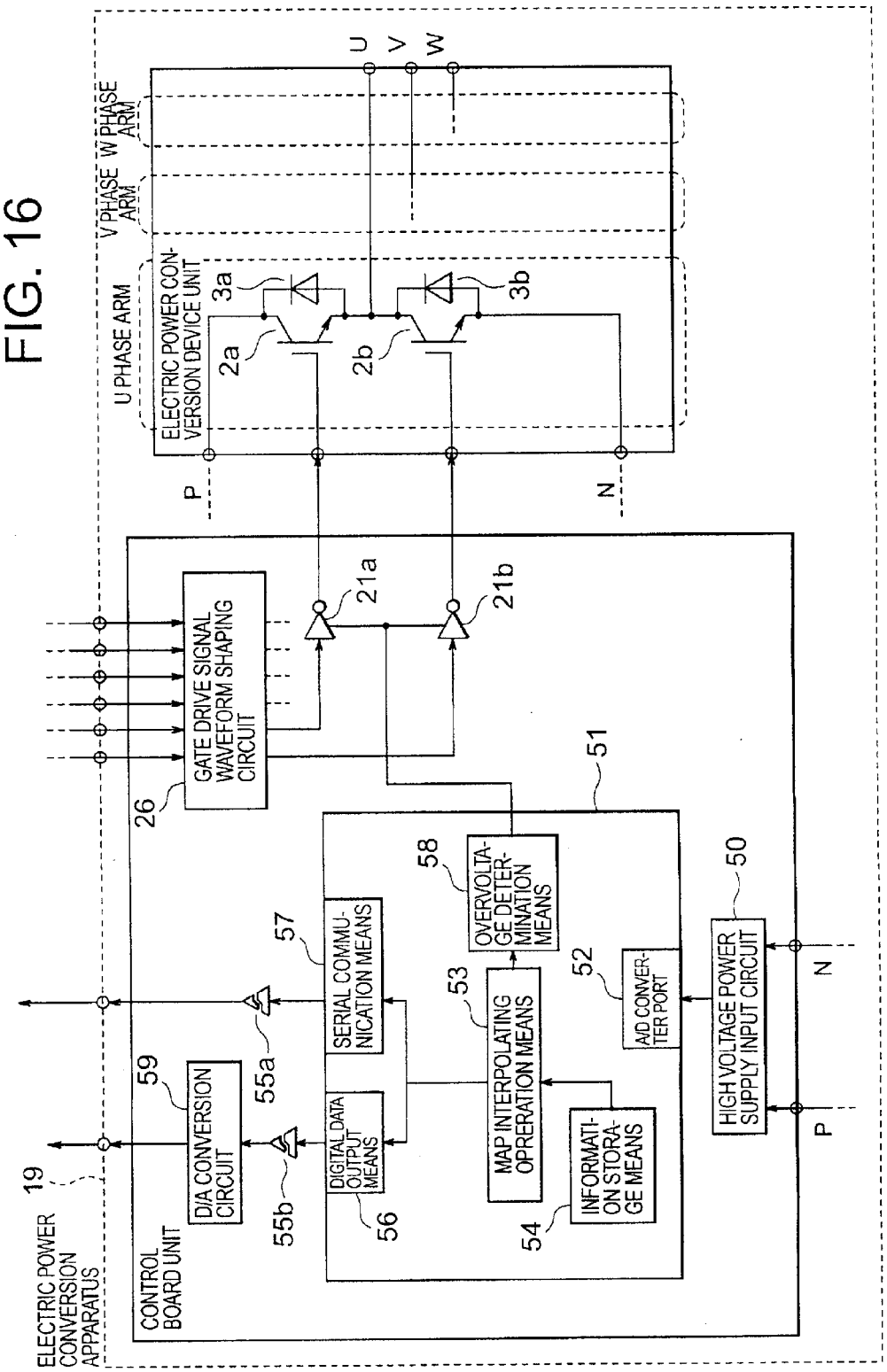
FIG. 16 is a block diagram showing a circuit configuration of an electric power conversion apparatus according to thirteenth and fifteenth embodiments of the present invention.

FIG. 16 is a block diagram showing a circuit configuration of an electric power conversion apparatus according to a thirteenth embodiment of this invention. In addition, in FIG. 16, the same numerals will be given to parts corresponding to those in FIG. 5, and the description on them will be omitted.

In the drawing, reference numeral 50 denotes a high voltage power supply input circuit as a voltage dividing circuit dividing high voltage power, reference numeral 51 denotes a microcomputer, reference numeral 52 denotes an A/D converter port, reference numeral 53 denotes a map interpolating operation means, and reference numeral 54 denotes information storage means. In addition, reference numeral 55 denotes insulated transmission means as output means, reference numeral 56 denotes digital data output means, reference numeral 57 denotes serial communication means, reference numeral 58 denotes overvoltage determination means, and reference numeral 59 denotes a D/A conversion circuit.

Next, operation will be described.

After performing voltage division and waveform shaping of an input voltage of a high voltage power supply, the high voltage power supply input circuit 50 inputs it into the A/D converter port 52 of the microcomputer 51, and obtains a high power supply voltage as an A/D conversion value. A map for obtaining a desired conversion characteristic (hereafter, a conversion characteristic map) is stored beforehand in the microcomputer 51, and a target output value is obtained from the A/D conversion value by the map interpolating operation means 53. Here, the meaning of preparing the conversion characteristic map is not only to process input voltage characteristics into arbitrary output voltage characteristics (convert characteristics), but also to make the output voltage value more accurate to the inputted high power supply voltage.

After obtaining the electric insulation of the high power supply voltage value after the characteristic conversion, which is obtained, by the insulated transmission means 55, then electric power conversion apparatus 19 outputs an analog voltage, which is the power supply reference on which the external system concerned is working, through the D/A conversion circuit 59 to the system (for example, a control unit giving a control signal to this apparatus) that is not shown and is arranged out of the electric power conversion apparatus 19, or outputs it as digital data via the serial communication means 57.

In addition, this embodiment is for performing electric insulation (reference power supply conversion) processing in the phase of digital information regardless of output forms such as analog voltage output or digital signal output, which is digitally converted, at the time of supplying the information to a system having a different reference power supply. Hence, since it becomes unnecessary to consider insulating operation from a high voltage power supply in all the equipment that operates on the basis of a low voltage power supply reference and is connected to this apparatus, it is possible to miniaturize each equipment.

Thus, this embodiment reads the voltage between P and N, which is a high power supply voltage, into a microcomputer by A/D conversion processing, converts the voltage into a voltage level on the basis of a low voltage power supply reference for an external control unit, and outputs it via serial communication, in an analog signal, or the like. Hence, since it becomes unnecessary to consider insulating operation from a high voltage power supply in all the equipment that operates on the basis of a low voltage power supply reference, it is possible to miniaturize each equipment.

Embodiment 14

Figure 17:
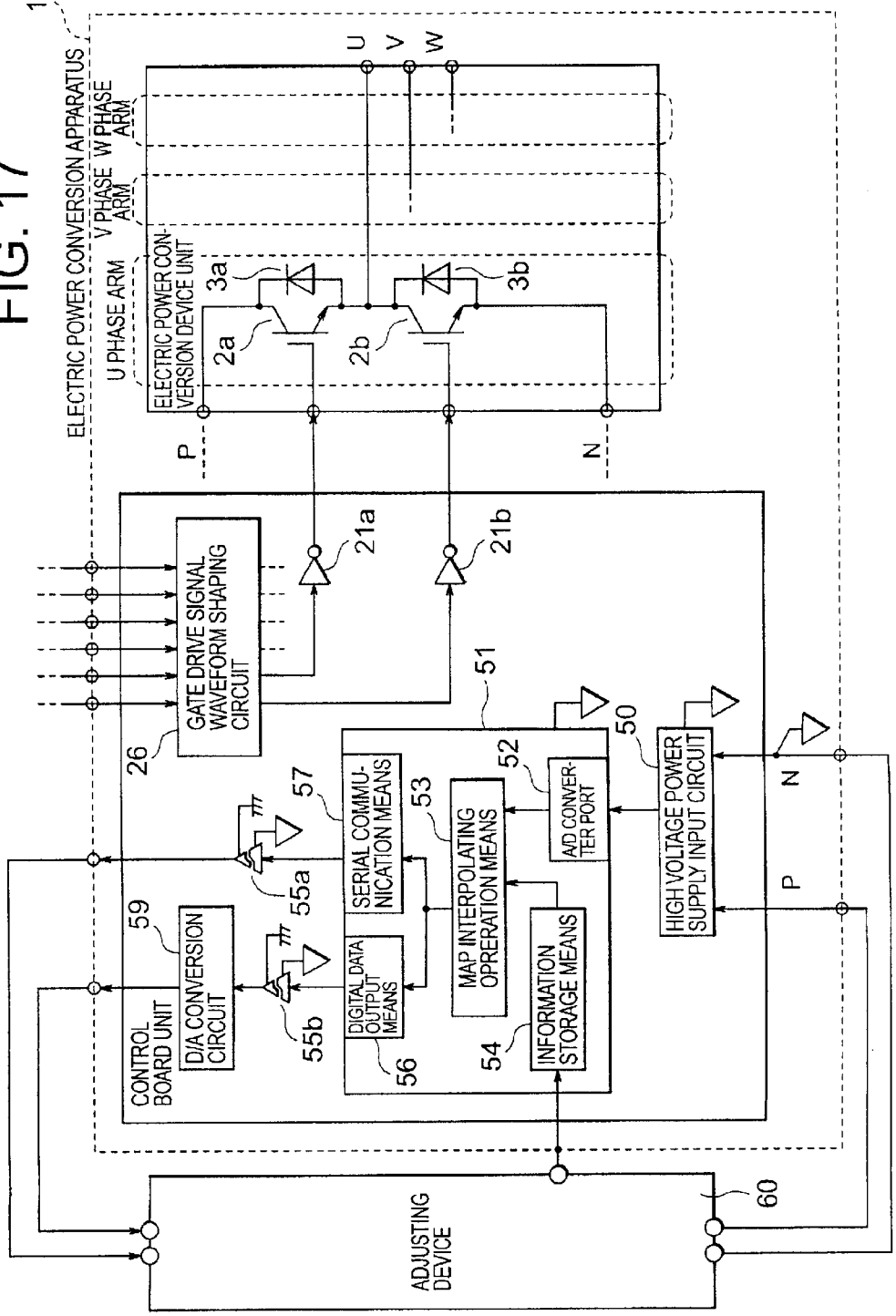
FIG. 17 is a block diagram showing a circuit configuration of an electric power conversion apparatus according to a fourteenth embodiment of the present invention.

FIG. 17 is a block diagram showing a circuit configuration of an electric power conversion apparatus according to a fourteenth embodiment of this invention. In addition, in FIG. 17, the same numerals will be given to parts corresponding to those in FIG. 16, and the description on them will be omitted.

In the drawing, reference numeral 60 denotes an adjusting device as adjusting means. The adjusting device 60 is connected to the electric power conversion apparatus 19 during an outgoing inspection step of the electric power conversion apparatus 19.

Here, a method of correcting a voltage map will be described.

The adjusting device 60 makes the electric power conversion apparatus 19 recognize that the process is at an outgoing inspection step, with using a recognition method with specified information transmission via the serial communication means 57, or a recognition method with a specified voltage pattern input to the high voltage power supply input circuit 50. The adjusting device 60 inputs a specified high voltage to the electric power conversion apparatus 19, and obtains the data, which the microcomputer 51 reads at the A/D converter port 52, by making the data outputted with using the serial communication means 57.

At the same time, the adjusting device 60 obtains a voltage equivalent to the A/D conversion result from the microcomputer 51 by making the data outputted from the digital data output means 56. The adjusting device 60 can obtain the correlation characteristics among the high voltage value (VPN) applied to the electric power conversion apparatus 19, the digital data (VAD) that is the result by the microcomputer 51 performing A/D conversion, and the actual analog output voltage (VAN) at the time of the microcomputer 51 outputting the voltage equivalent to an A/D conversion value, by repeating the same steps about a plurality of high voltage points. According to the above correction means, it becomes possible to extremely decrease a measurement error resulting from the accuracy and linearity of electronic components by obtaining both of the actual high voltage input value and the actual A/D conversion result which the macro computer obtains.

In consequence, the adjusting device 60 obtains the conversion characteristic map for a digital data output, where the arbitrary processing of the input voltage characteristics and the high accuracy of the output value to the high power supply voltage inputted are made to be compatible, from the VPN-VAD characteristics. Similarly, the adjusting device 60 obtains the characteristic conversion map for an analog voltage output from the VPN-VAD characteristics, and the VAD-VAN characteristics. The adjusting device 60 makes the information storage means 54, incorporated in electric power conversion apparatus 19, store the characteristic conversion maps.

As this storage method, it is also good to directly write the maps from the adjusting device 60, or it is also good to transmit the maps to the microcomputer 51, incorporated in the electric power conversion apparatus 19, with using the serial communication means 57 etc., and to make the microcomputer 51 write the maps. Thereby, since an external control circuit can monitor a high power supply voltage by a signal on the basis of a low voltage power supply reference, electric insulating operation from a high power supply voltage becomes unnecessary, and hence optimal layout in the improvement of EMI-proof property, or a safety aspect becomes possible.

Thus, in this embodiment, by providing the interpolating operation means of storing beforehand the conversion value of the high voltage power supply in two or more points in a microcomputer as map data at the time of shipment in order to correct the dispersion of electronic component characteristics in a conversion circuit at the time of performing the A/D conversion processing of the high voltage power supply at the microcomputer, it is possible to provide a high power supply voltage monitoring circuit excellent in voltage measurement accuracy and linearity without using highly accurate electronic components.

Embodiment 15

The circuit configuration of this embodiment is not shown, but what is the same as that in the above-described thirteenth embodiment (circuit configuration of FIG. 16) is used, and the adjusting device 60 described in the above-described fourteenth embodiment is connected to this.

At the time of creating characteristic conversion maps, the above-described adjusting device 60 calculates an overvoltage determination value from the known overvoltage determination standard value, and makes the information storage means 54, incorporated in electric power conversion apparatus 19, store the overvoltage determination value.

The electric power conversion apparatus 19 comprises means for comparing an A/D conversion value of a divided value of the high power supply voltage with an overvoltage determination value stored beforehand in microcomputer 51, that is, overvoltage determination means 58. Hence, in order to protect the overvoltage breakdown of all the components mounted in an inverter apparatus, if an overvoltage level is exceeded, the electric power conversion apparatus 19 not only shut off a semiconductor device with suppressing the switching speed (di/dt characteristic) of the semiconductor device, but also makes an external control unit know that the semiconductor device is shut off, by abnormality occurrence signal output means such as the serial communication means 57 where it is converted into the voltage level on the basis of the low voltage power supply reference.

Thus, in this embodiment, as the overvoltage protection of all the components mounted in an inverter apparatus, the electric power conversion apparatus 19 not only shuts off all semiconductor devices by suppressing the di/dt of the semiconductor device for electric power conversion if the high power supply voltage between P and N exceeds the overvoltage level beforehand set in the microcomputer, but also outputs to an external control unit that the semiconductor devices are shut off, via serial communication, where it is converted into the voltage level on the basis of the low voltage power supply reference, or in a logic signal, or the like. Hence, it is possible to prevent beforehand the overvoltage breakdown of high voltage components other than the semiconductor device for electric power conversion that are mounted in the inverter apparatus, for example, a DC voltage smoothing capacitor.

As described above, according to this invention, since a power supply circuit for supplying power to a drive and protection circuit of a semiconductor device for electric power conversion can be made to be integrated in the same module, the miniaturization and weight reduction of an electric power conversion apparatus, and in extension, the miniaturization of an inverter apparatus itself are attained.

In addition, by integrating the power supply circuit contained in another case up to now, it becomes possible not only to reduce a wire harness, but also to sharply reduce noise superimposed on power supply lines from the external. Hence, it is possible to improve system reliability in the use under a harsh environment like a vehicle-mounted application.

In addition, since all the signals of a high voltage power supply system are processed within the electric power conversion apparatus, all signals to an external control unit are only those based on a low voltage power supply reference. That is, since electric isolation of the high voltage power supply system from the low voltage power supply system is clear, this becomes most desirable inverter apparatus structure in safety in a system where the low voltage power supply system like a vehicle-mounted application is made to be common with the car body ground.

Furthermore, since the chip temperature of the semiconductor device for electric power conversion can be read in high precision and high response with using an on-chip temperature sensor, it becomes possible to use the semiconductor device for electric power conversion up to its full electric rating.

Moreover, the exact temperature of the semiconductor device for electric power conversion is outputted to an external control circuit. Hence, it is possible to suppress the heat generation of the semiconductor device for electric power conversion by suppressing the torque of a three phase motor, i.e., a motor line current by an external control circuit before an overheat protective function works, and hence it is possible to prevent a system halt by the overheat protective function beforehand.

In addition, it is possible to protect the electric power conversion apparatus, and in extension, the entire inverter apparatus, and to prevent the leading to a secondary calamity by shutting off the semiconductor device for electric power conversion even if the electric power conversion apparatus malfunctions due to a certain factor.

Furthermore, it is effective for trouble shooting at the time of corrective maintenance to store diagnosis information, which is the contents of malfunctions, in the external control circuit.

Moreover, the state where overcurrent is flowing in the semiconductor device for electric power conversion is outputted to an external control circuit due to a certain factor. Hence, it is possible to suppress the heat generation of the semiconductor device for electric power conversion by suppressing the torque of a three phase motor, i.e., a motor line current by the external control circuit before an overheat protective function or short-circuit current protection works, and hence it is possible to prevent a system halt by the protective function beforehand.

In addition, since an external control circuit can monitor the high power supply voltage by a signal on the basis of a low power supply voltage reference, electric insulating operation from the high power supply voltage becomes unnecessary, and an optimal layout in the improvement of EMI-proof property and safety becomes possible.

Furthermore, it is possible to prevent beforehand the overvoltage breakdown of high voltage components other than the semiconductor device for electric power conversion that are mounted in an inverter apparatus, such as a DC voltage smoothing capacitor.

What is claimed is:

1. In an inverter apparatus for converting a DC voltage into an AC voltage,
an electric power conversion apparatus, wherein a semiconductor device for electric power conversion, a drive and protection means for driving and protecting the semiconductor device, and a power circuit supplying electric power to the drive and protection means are integrated in one module,
wherein said drive and protection means and said power circuit are mixedly mounted on both sides of a board, and a metal shielding plate is arranged between the board and the semiconductor device.

2. The electric power conversion apparatus according to claim 1, wherein said board on which said drive and protection means and said power circuit are mixedly mounted is a multilayer board, and heat generated in an inner layer pattern of the board is radiated through the metal shielding plate to a base plate connected to an external cooler.

3. The electric power conversion apparatus according to claim 2, wherein a low profile type sheet transformer made by combining ferrite core material and a multilayer board is used as a switching transformer in said power circuit.

4. In an inverter apparatus for converting a DC voltage into an AC voltage,
an electric power conversion apparatus, wherein a semiconductor device for electric power conversion, a drive and protection means for driving and protecting the semiconductor device, and a power circuit supplying electric power to the drive and protection means are integrated in one module,
wherein said drive and protection means comprises:
a diode device incorporated in the semiconductor device;
a constant current circuit which provides a constant current to the diode device;
a waveform shaping circuit which shapes a waveform of a voltage between ends of the diode device; and
a microcomputer which fetches a voltage between ends of the diode device whose waveform is shaped, and
wherein the semiconductor device is shut off on the basis of the voltage between ends of the diode device and overheat determination temperature data stored beforehand.

5. The electric power conversion apparatus according to claim 4, wherein the microcomputer includes means for correcting a temperature map at the time of product shipment and storing the overheat determination temperature data beforehand, and interpolation means for performing interpolation on the basis of the overheat determination temperature data and a detection output of a temperature detecting element on said board during normal operation.

6. In an inverter apparatus for converting a DC voltage into an AC voltage,
an electric power conversion apparatus, wherein a semiconductor device for electric power conversion, a drive and protection means for driving and protecting the semiconductor device, and a power circuit supplying electric power to the drive and protection means are integrated in one module,
wherein said drive and protection means comprises:
a sensing terminal which senses a shunt current of the semiconductor device for electric power conversion,
conversion means for convening the shunt current into a voltage; and
short-circuit current detection means for comparing the voltage from the conversion means with a voltage equivalent to a short-circuit current of the semiconductor device, and
wherein the semiconductor device is shut off on the basis of the comparison result of the short-circuit current detection means.

7. In an inverter apparatus for converting a DC voltage into an AC voltage,
an electric power conversion apparatus, wherein a semiconductor device for electric power conversion, a drive and protection means for driving and protecting the semiconductor device, and a power circuit supplying electric power to the drive and protection means are integrated in one module,
wherein said drive and protection means comprises:
a sensing terminal which senses a shunt current of the semiconductor device;
conversion means for converting the shunt current into a voltage; and
overcurrent detection means for comparing the voltage from the conversion means with a voltage equivalent to an overcurrent of the semiconductor device, and
wherein di/dt of the semiconductor device for electric power conversion is suppressed without shutting off a switching operation of the semiconductor device on the basis of the comparison result of the overcurrent detection means.

8. In an inverter apparatus for converting a DC voltage into an AC voltage,
an electric power conversion apparatus, wherein a semiconductor device for electric power conversion, a drive and protection means for driving and protecting the semiconductor device, and a power circuit supplying electric power to the drive and protection means are integrated in one module,
wherein said drive and protection means comprises gate short-circuit detection means for comparing a logic level of a gate input signal for driving the semiconductor device with a logic level of a gate terminal voltage of the semiconductor device, and
wherein when the comparison result of the gate short-circuit detection means is negative, the semiconductor device is shut off.

9. In an inverter apparatus for converting a DC voltage into an AC voltage,
an electric power conversion apparatus, wherein a semiconductor device for electric power conversion, a drive and protection means for driving and protecting the semiconductor device, and a power circuit supplying electric power to the drive and protection means are integrated in one module,
wherein said drive and protection means comprises gate voltage abnormality determination means for comparing a gate voltage of a gate of the semiconductor device with a reference voltage for gate voltage abnormality determination, and wherein the semiconductor device is shut off on the basis of the comparison result of the gate voltage abnormality determination means.

10. The electric power conversion apparatus according to claim 4, wherein said drive and protection means suppresses di/dt of the semiconductor device when the semiconductor device is shut off.

11. The electric power conversion apparatus according to claim 7, wherein, when the semiconductor device is shut off, said drive and protection means simultaneously shuts off all the gate input signals of semiconductor devices other than said semiconductor device, and said drive and protection means also outputs to an external control unit information indicating which of a plurality of protective functions shut off the semiconductor device.

12. In an inverter apparatus for converting a DC voltage into an AC voltage,
an electric power conversion apparatus, wherein a semiconductor device for electric power conversion, a drive and protection means for driving and protecting the semiconductor device, and a power circuit supplying electric power to the drive and protection means are integrated in one module,
wherein the electric power conversion apparatus further comprises a voltage dividing circuit which divides a high power supply voltage; a microcomputer which shapes into a waveform a voltage divided by said voltage dividing circuit and performs A/D conversion processing, and performs a map interpolating operation of the A/D converted value, and output means for converting a calculation result of the microcomputer into voltage level on the basis of a low voltage power supply reference, and outputting said voltage level to an external control unit as a voltage value of a high voltage power supply.

13. The electric power conversion apparatus according to claim 12, further comprising adjusting means for correcting a voltage map before product shipment and storing A/D conversion map data of a divided voltage of a high power supply voltage in the microcomputer beforehand.

14. The electric power conversion apparatus according to claim 12, wherein said microcomputer has overvoltage determination means for comparing overvoltage data, stored beforehand, with an A/D-converted value of a divided voltage of the high power supply voltage, and wherein, if the comparison result of the overvoltage determination means exceeds an overvoltage level, the semiconductor device is shut off, di/dt of the semiconductor device is suppressed, and the microcomputer outputs information to an external control unit indicating that the semiconductor device is shut off.

* * * * *